United States Patent
Scheuerlein et al.

(10) Patent No.: US 6,504,753 B1
(45) Date of Patent: Jan. 7, 2003

(54) METHOD AND APPARATUS FOR DISCHARGING MEMORY ARRAY LINES

(75) Inventors: Roy E. Scheuerlein, Cupertino, CA (US); Matthew P. Crowley, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/897,784

(22) Filed: Jun. 29, 2001

Related U.S. Application Data

(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.$^7$ .............................................. G11C 11/36
(52) U.S. Cl. ....................... 365/175; 365/105; 365/159; 365/189.09
(58) Field of Search .......................... 365/94, 100, 103, 365/104, 105, 171, 173, 175, 207, 71, 159, 189.09, 189.07, 148, 243

(56) References Cited

U.S. PATENT DOCUMENTS

| | | | |
|---|---|---|---|
| 4,646,266 A | | 2/1987 | Ovshinsky et al. ......... 365/105 |
| 5,535,156 A | * | 7/1996 | Levy et al. ................. 365/175 |
| 5,745,407 A | * | 4/1998 | Levy et al. ................. 365/159 |
| 5,751,012 A | | 5/1998 | Wolstenholme et al. ....... 257/5 |
| 5,776,810 A | | 7/1998 | Guterman et al. .......... 438/258 |
| 5,835,396 A | | 11/1998 | Zhang ......................... 365/51 |
| 5,883,409 A | | 3/1999 | Guterman et al. .......... 257/316 |
| 6,034,882 A | | 3/2000 | Johnson et al. ............. 365/103 |
| 6,055,180 A | | 4/2000 | Gudesen et al. ............ 365/175 |
| 6,185,143 B1 | * | 2/2001 | Perner ........................ 365/210 |
| 6,256,247 B1 | * | 7/2001 | Perner ........................ 365/209 |
| 6,341,084 B2 | * | 1/2002 | Numataq et al. ........... 365/158 |
| 6,351,406 B1 | * | 2/2002 | Johnson et al. ............. 365/103 |

OTHER PUBLICATIONS

Kim C. Hardee and Rahul Sud, "A Fault–Tolerant 30 ns/375 mW 16K×1 NMOS Static RAM,"IEEE Journal of Solid–State Circuits, vol. SC–16, No. 5, Oct. 1981, pp. 435–443.
Toshio Wada et al, "A 15–ns 1024–Bit Fully Static MOS RAM," IEEE Journal of Solid–State Circuits, vol. SC–13, No. 5, Oct. 1978, pp. 635–639.
U.S. App. No. 09/897,785, filed Jun. 29, 2001, "Method And Apparatus For Writing Memory Arrays Using External Source Of High Programming Voltage," inventor Roy E. Scheuerlein, 68 pp.
U.S. App. No. 09/748,815, filed Dec. 22, 2000, Charge Pump Circuit, inventors Mark G. Johnson et al, 40 pp.

(List continued on next page.)

*Primary Examiner*—David Nelms
*Assistant Examiner*—Gene N. Auduong
(74) *Attorney, Agent, or Firm*—Zagorin, O'Brien & Graham, LLP

(57) ABSTRACT

A passive element memory array preferably biases selected X-lines to an externally received $V_{PP}$ voltage and selected Y-lines to ground. Unselected Y-lines are preferably biased to $V_{PP}$ minus a first offset voltage, and unselected X-lines biased to a second offset voltage (relative to ground). The first and second offset voltages preferably are identical and have a value of about 0.5 to 2 volts. The $V_{PP}$ voltage depends upon the memory cell technology used, and preferably falls within the range of 5 to 20 volts. The area otherwise required for an on-chip $V_{PP}$ generator and saves the power that would be consumed by such a generator. In addition, the operating temperature of the integrated circuit during the programming operation decreases, which further decreases power dissipation. When discharging the memory array, the capacitance between layers is preferably discharged first, then the layers are discharged to ground.

51 Claims, 19 Drawing Sheets

OTHER PUBLICATIONS

U.S. App. No. 09/748,649, filed Dec. 22, 2000, "Partial Selection of Passive Element Memory Cell Sub–Arrays for Write Operations," inventors Roy E. Scheuerlein and Matthew P. Crawley, 38 pp.

U.S. App. No. 09/897,771, filed Jun. 29, 2001, "Method and Apparatus for Biasing Selected and Unselected Array Lines when Writing a Memory Array," inventor Roy E. Scheuerlein, 76 pp.

U.S. App. No. 09/897,705, filed Jun 29, 2001, "Three–Dimensional Memory Array Incorporating Serial Chain Diode Stack," inventors Bendik Kleveland et al., 72 pp.

U.S. App. No. 09/896,468, filed Jun. 29, 2001, "Current Sensing Method and Apparatus Particularly Useful for a Memory Array of Cells having Diode–Like Characteristics," inventor Roy E. Scheuerlein, 54 pp.

U.S. App. No. 09/897,704, filed Jun. 29, 2001, "Memory Array Incorporating Noise Detection Line," inventor Roy E. Scheuerlein, 46 pp.

U.S. App. No. 09/560,626, filed Apr. 28, 2000, "Three–Dimensional Memory Array and Method of Fabrication," inventor Johan Knall, 48 pp.

U.S. App. No. 09/638,428, filed Aug. 14, 2000, "Low Cost Three–Dimensional Memory Array," inventors Mark G. Johnson et al., 25 pp.

U.S. App. No. 09/814,727, filed Mar. 21, 2001, "Three Dimensional Memory Array and Method of Fabrication," inventors Johan Knall and Mark G. Johnson, 49 pp.

U.S. App. No. 09/896,814, filed Jun. 29, 2001, "Memory Device with Row and Column Decoder Circuits Arranged in a Checkerboard Pattern Under a Plurality of Memory Arrays," inventor Roy E. Scheuerlein, 28 pp.

U.S. App. No. 09/895,960, filed Jun. 29, 2001, "Method and System for Increasing Programming Bandwidth in a Non–Volatile Memory Device," inventors Christopher S. Moore et al, 21 pp.

U.S. App. No. 09/896,815, filed Jun. 29, 2001, "Memory Device and Method for Sensing While Programming a Non–Volatile Memory Cell," inventors Bendik Kleveland et al., 26 pp.

* cited by examiner

METHOD AND APPARATUS FOR DISCHARGING MEMORY ARRAY LINES

CROSS-REFERENCE TO RELATED APPLICATIONS

This application claims the benefit of the following U.S. provisional applications, each of which was filed on Mar. 21, 2001: U.S. Provisional Application No. 60/277,794; U.S. Provisional Application No. 60/277,815; and U.S. Provisional Application No. 60/277,738. Each of the above-referenced applications is hereby incorporated by reference.

BACKGROUND OF THE INVENTION

1. Field of the Invention

The present invention relates to semiconductor memory arrays, and particularly to three-dimensional passive element memory arrays.

2. Description of the Related Art

Integrated circuits incorporating a passive element memory array require a high-voltage and high-current programming voltage source due to the large number of leakage paths in the array and the high voltage required to program the element conductivity. The leakage current represents a significant portion of the power dissipation of such circuits during programming. There remains a need for improved performance of such circuits, reduced leakage currents when writing, and faster write time of a selected memory cell.

SUMMARY OF THE INVENTION

An improved passive element memory array biases unselected X-lines to one voltage, and biases unselected Y-lines to another voltage, both having a value less than the programming voltage. In a preferred embodiment, four voltage levels are applied to the array to bias the array for write mode: 1) a programming (VPP) voltage applied to the selected X-line; 2) a somewhat lower voltage equal to VPP minus a first offset voltage applied to the unselected Y-lines; 3) a voltage equal to a second offset voltage (relative to ground) applied to the unselected X-lines; and 4) a ground reference voltage applied to the selected Y-line. The first and second offset voltages preferably are identical and have a value of about 0.5 to 2 volts. The VPP voltage depends upon the memory cell technology used, and preferably falls within the range of 5 to 20 volts.

The respective bias voltages are preferably applied to the unselected X-lines and the unselected Y-lines before the selected X-line and selected Y-line are driven to place the programming voltage VPP across the selected memory cell. As a result, the unselected X-lines and Y-lines in the array are already biased before the selected X-line is driven, and the rise time of the selected X-line (e.g., during its transition from ground or the offset voltage above ground to VPP) may be accomplished much faster. Leakage currents through the unselected memory cells in the array are now provided by the bias voltage sources, and are no longer provided by current flow through the selected X-line and Y-line. Consequently, the magnitude of the current traversing through the selected X-line and Y-line is much lower and results in less voltage drop due to the distributed resistance of the selected X-line and Y-line. For a required programming voltage impressed across a selected memory cell, the VPP voltage need not be quite as large since a greater portion of the VPP voltage actually reaches the selected memory cell.

The high voltage source required to program the memory cells may be generated on-chip by a $V_{PP}$ generator, sometimes frequently implemented as charge pump circuits. However, the chip area required by such on-chip circuitry to generate the programming voltage source with enough current capability to support the leakage current of unselected memory cells is substantial. Alternatively, an external source of the $V_{PP}$ programming voltage is provided, which reduces the area otherwise required for an on-chip $V_{PP}$ generator and saves the power that would be consumed by such a generator. In addition, the operating temperature of the integrated circuit during the programming operation decreases, and reduces the leakage current through the reverse biased unselected memory cells. As a result, the total power consumption is reduced by quite a bit more than just the savings achieved by removing the $V_{PP}$ generator circuit.

By removing the $V_{PP}$ generator, a higher value for $V_{PP}$ may be used with the same semiconductor process, which allows much faster programming. Alternatively, for a given voltage necessary to program a particular memory cell technology, the overall voltage requirements of the semiconductor technology may be relaxed. This may allow an even greater savings in integrated circuit area, as the spacing between various on-chip structures may be reduced. Preferably, the programming voltage received from an external voltage source is the highest voltage conveyed anywhere in the chip, and other bias voltages may either be received from other external voltage sources or generated using on-chip circuitry.

When discharging the memory array, the capacitance between layers (i.e., between memory array lines on adjacent layers), in particular the substantial capacitance from the unselected Y-lines to adjacent unselected X-lines, is preferably discharged first by driving their X-lines and Y-lines to nearly the same voltage. The array lines may then be safely discharged to ground without coupling array lines on adjacent layers below ground and potentially causing a CMOS latchup event to occur.

The invention is particularly applicable to a passive element array having an antifuse and diode in series as the memory element, but is also applicable to other passive element memory arrays. Other preferred embodiments are provided, and each of the preferred embodiments described herein can be used alone or in combination with one another.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DESCRIPTION OF THE PREFERRED EMBODIMENT(S)

For passive element memory arrays, a high voltage $V_{PP}$ (also variously known as and described herein as $V_P$ or as $V_{PROG}$) is applied across a memory cell within the memory array to program the conductivity of the memory cell. In a write mode of operation, for example, one word line may be raised to a positive voltage and one bit line may be held at ground. It is necessary to apply the $V_{PP}$ to just a selected memory cell, but not to other memory cells that are also connected to the selected word line and bit line.

Figure 1:
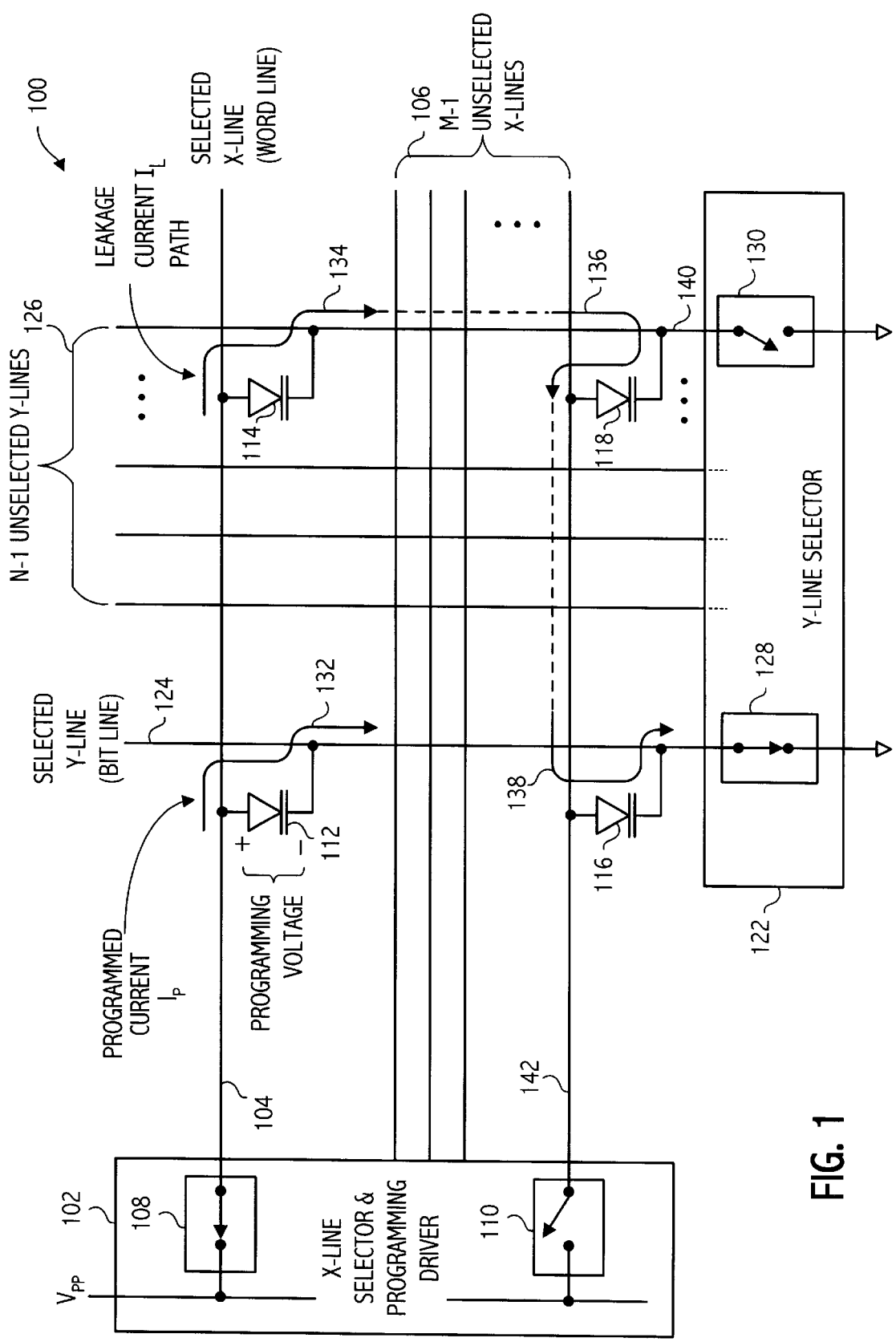
FIG. 1 is an electrical schematic diagram of a passive element memory array which depicts leakage current through unselected memory cells.

Referring now to FIG. 1, a memory array 100 is shown which utilizes passive element memory cells. Each passive element memory cell is generally a two-terminal memory cell having a steering element in series with a state change element, together connected between one of M possible X-lines (i.e., word lines) and one of N possible Y-lines (i.e., bit lines). These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

One particular antifuse memory cell 112 is shown connected between a selected X-line 104 and a selected Y-line 124. To program the memory cell 112, the selected X-line 104 is coupled by driver 108 within the X-line selector 102 to a programming voltage source $V_{PP}$. The magnitude of such a programming voltage source may be 5 to 20 volts, depending upon the structure of the particular memory cell technology incorporated within memory array 100. The selected Y-line 124 is coupled to ground by driver 128 within Y-line selector 122, thus impressing substantially the entire $V_{PP}$ voltage across memory cell 112, which causes the antifuse to "pop" and suddenly become dramatically more conductive. This increased conductivity results in a programmed current $I_P$ (labeled as 132) flowing from the $V_{PP}$ source to ground through the now programmed memory cell 112. The magnitude of the programmed current $I_P$ may frequently reach 100 microamps.

While the memory cell 112 is being programmed, the remaining M−1 unselected X-lines 106 are "floated" by the X-line selector 102, as represented by the programming driver 110 shown as an open switch. Likewise, the N−1 unselected Y-lines 126. are also floated, as represented by the driver 130 within Y-line selector 122, also shown as an open switch. Nonetheless, a significant leakage path exists in parallel with the programming current through memory cell 112, and a leakage current flows potentially throughout the entire memory array 100. Memory cell 114 represents other memory cells connected to the selected X-line 104 (also termed "half-selected" memory cells). A current 134 flows from the selected X-line 104 through each such memory cell 114 to the corresponding Y-line of the particular memory cell. Consider briefly the current 134 flowing into unselected Y-line 140. A reverse biased memory cell 118 (i.e., the steering element within the memory cell being reversed biased) provides a leakage path between unselected Y-line 140 and unselected X-line 142. The current flow through this particular leakage path is labeled 136. Any current finding its way onto unselected X-line 142 will be conducted through memory cell 116 to the selected Y-line 124, which is grounded by the Y-line driver 128. The leakage currents through the remainder of the memory array 100 are highest if virtually all other memory cells have already been programmed. In such a case, memory cell 114, memory cell 118, and memory cell 116 are assumed to have been programmed to a relatively small forward resistance. The magnitude of the leakage current path described thus far is limited by memory cell 118 which is reverse biased, whereas memory cell 114 and memory cell 116 are both forward biased and do little to limit the magnitude of current flow therethrough. Since memory cell 114 represents all other memory cells connected to the selected X-line, there are up to N−1 such "half-selected" memory cells, each of which conducts a certain amount of current from the selected X-line 104 to its corresponding unselected Y-line. Since the memory cell 118 represents those memory cells connected between an unselected Y-line and an unselected X-line, there are (M−1)×(N−1) such memory cells. Similarly, memory cell 116 represents those memory cells connected between an unselected X-line and the selected Y-line. There are M−1 such "half-selected" memory cells analogous to memory cell 116.

Figure 2:
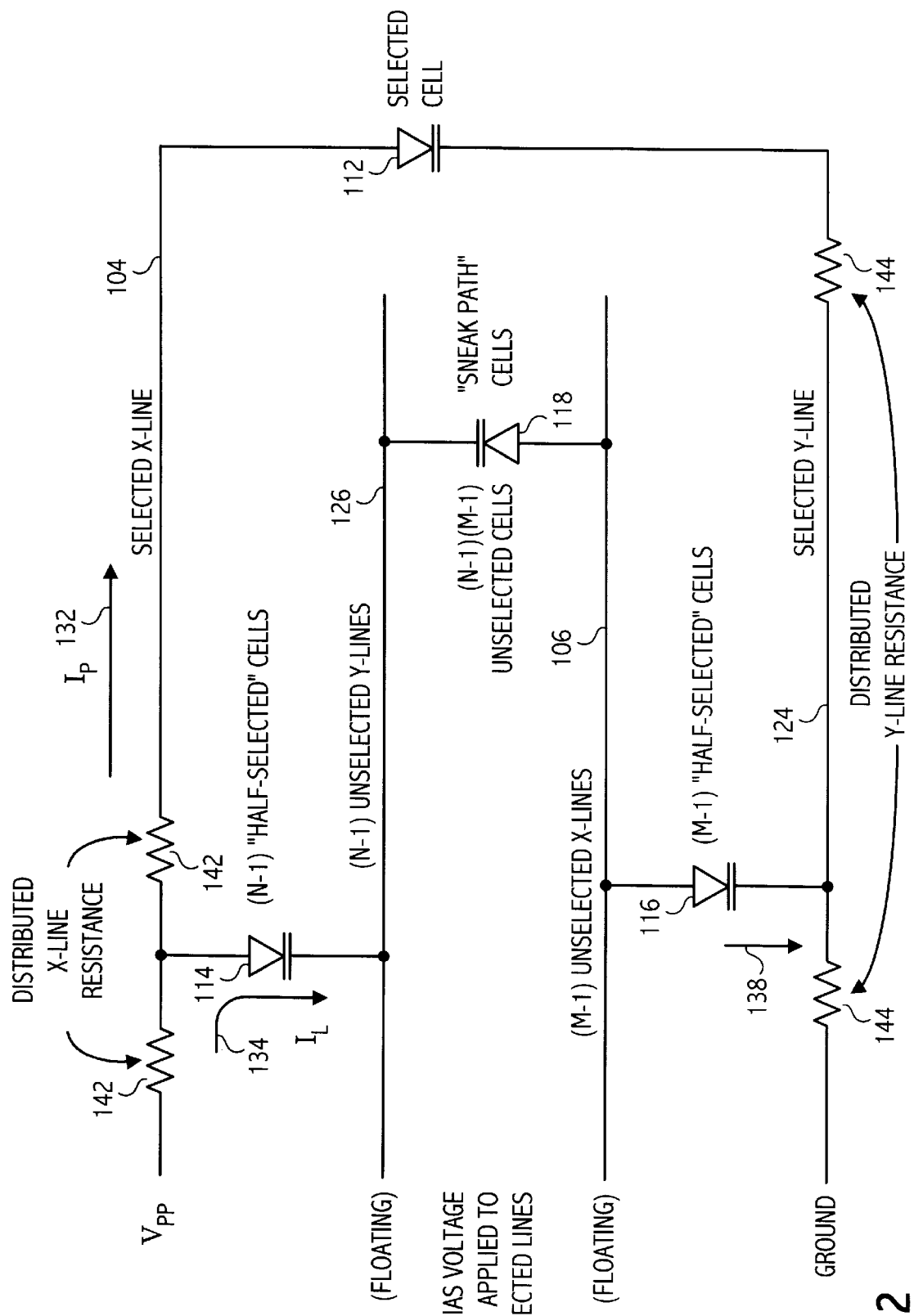
FIG. 2 is a simplified electrical schematic diagram further depicting the leakage current through unselected memory cells shown in FIG. 1.

A simplified schematic representation of the current flow through the various memory cells is shown in FIG. 2. When tallying the current flow from the programming voltage source $V_{PP}$ during the programming of selected memory cell 112, the programmed current $I_P$ flows from the selected X-line 104 through the selected memory cell 112, to the selected Y-line 124 (which is grounded). In addition, an effective series circuit is formed by the remainder of the array which includes the parallel combination of N−1 forward biased memory cells (analogous to memory cell 114) in series with the parallel combination of (M−1)×(N−1) reverse biased memory cells (analogous to memory cell 118), in series with the parallel combination of M−1 forward biased memory cells (analogous to memory cell 116). Using values for M and N that may be encountered in practice, a memory array 100 could easily have 1,024 X-lines and 1,024 Y-lines (i.e., M=N=1024). Consequently, the leakage current which the programming voltage source $V_{PP}$ must support in addition to the programmed current itself is the leakage current flowing through one million reverse biased memory cells having programmed antifuses. This can be a substantial amount of current relative to the programmed current itself.

The leakage current 134 is actually a distributed current through the N−1 half-selected memory cells 114 spaced along the selected X-line 104, and results in a voltage drop along the selected X-line due to the distributed X-line resistance 142. Similarly, the leakage current 138 is also a distributed current through the N−1 half-selected memory cells 116 spaced along the selected Y-line 124, and results in a similar voltage drop along the selected Y-line 124 due to the distributed Y-line resistance 144. Consequently, the voltage developed across the selected memory cell 112 may be significantly lower than the VPP voltage (relative to ground), especially if the selected memory cell is at the far end of its associated X-line relative to the X-line programming driver 102, and also if the selected memory cell is at the far end of its associated Y-line relative to the Y-line selector 122 (i.e., the Y-line programming driver). If a particular programming current 132 is required to program a selected memory cell, a far larger current actually may be required from the VPP voltage source and flow into the selected X-line.

The current flow through unselected memory cells also causes write performance to be very slow. This is partly due to the degraded voltage that may be developed across a selected memory cell, as described above, and the increased programming time required for even small decreases in programming voltage across a cell. Additionally, there may be patterns of previously programmed memory cells in the array that cause various unselected Y-lines to stay at fairly low voltages, even though the selected word line has risen to VPP, while other unselected Y-lines rise as the selected X-line is driven from ground to VPP, being charged through unselected memory cells previously programmed to a low resistance state. Not all unselected Y-lines and X-lines rise to the same voltage by leakage path currents since the leakage path current depends on whether the half selected cells have been programmed to low resistance or not. Some patterns, for example when all the half selected cells along the selected Y-line have been programmed but none of the half selected cells along the selected X-line have been programmed, cause the unselected Y-line voltages to be close to ground voltage and therefore it is possible that some of the half selected cells are exposed to voltages near the VPP level, and due to variations in manufacturing and materials, risk false programming events.

Figure 3:
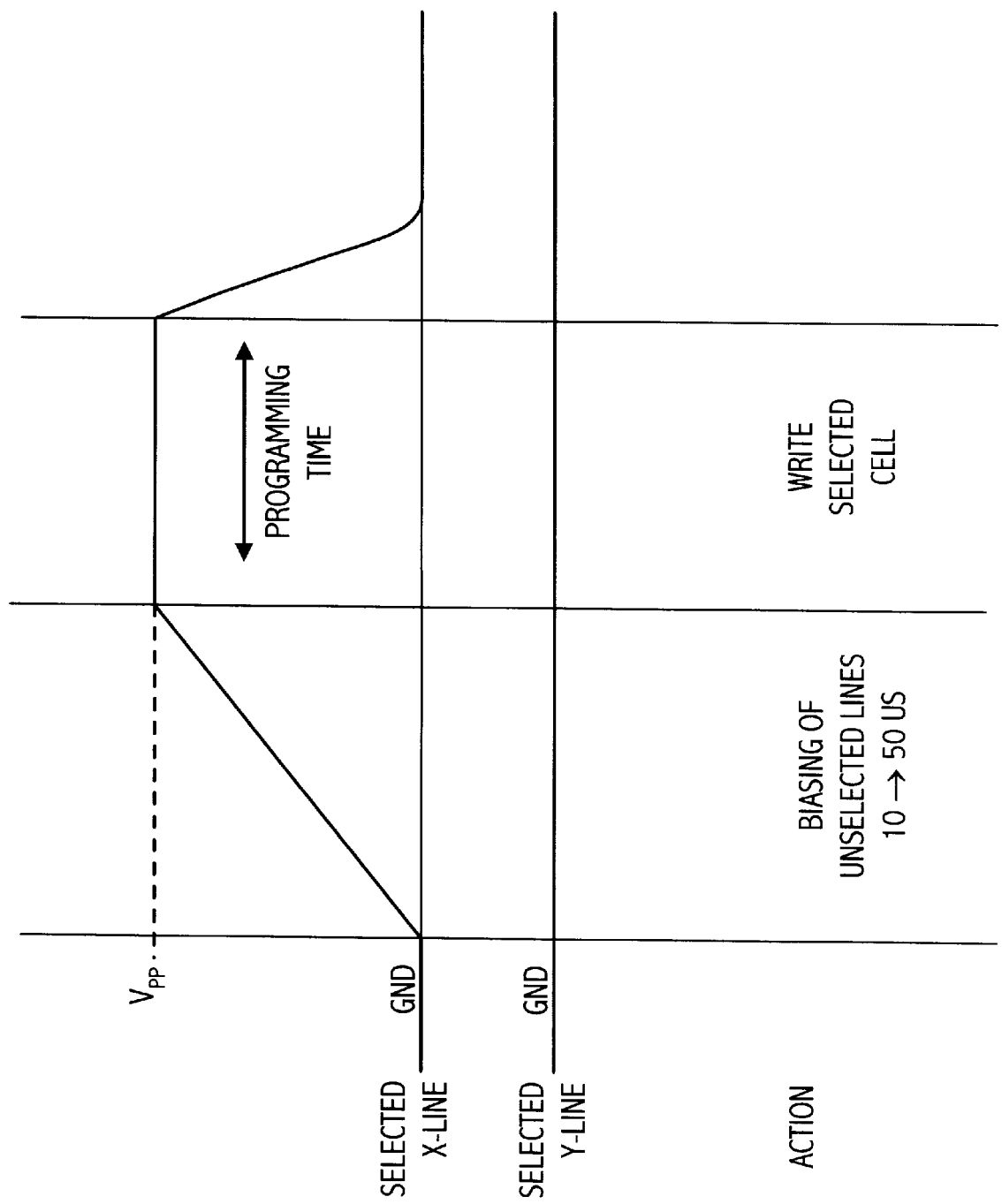
FIG. 3 is a timing diagram depicting a selected X-line in a passive element memory array.

Other patterns, for example when all the half selected cells along the X-line have been programmed but none of the half selected cells along the Y-line have been programmed, cause the unselected Y-lines voltages to be driven upward as the selected X-line is driven from ground to VPP. This charging of unselected lines robs available current from the VPP supply and increases the time required to develop a steady-state programming voltage across the selected memory cell. This effect is briefly illustrated in FIG. 3, which shows a typical waveform for a selected X-line when programming a selected memory cell. The selected X-line is driven high over a period of time of perhaps 10–50 μs, during which unselected lines within the memory array are also being charged or biased. Only after the selected X-line voltage reaches the VPP level (due to the distributed resistance of the X-line and Y-line, usually somewhat less than the VPP level actually reaches the selected memory cell), the voltage across the selected memory cell is maintained for a prescribed programming time to accomplish the writing of the memory cell.

Figure 4:
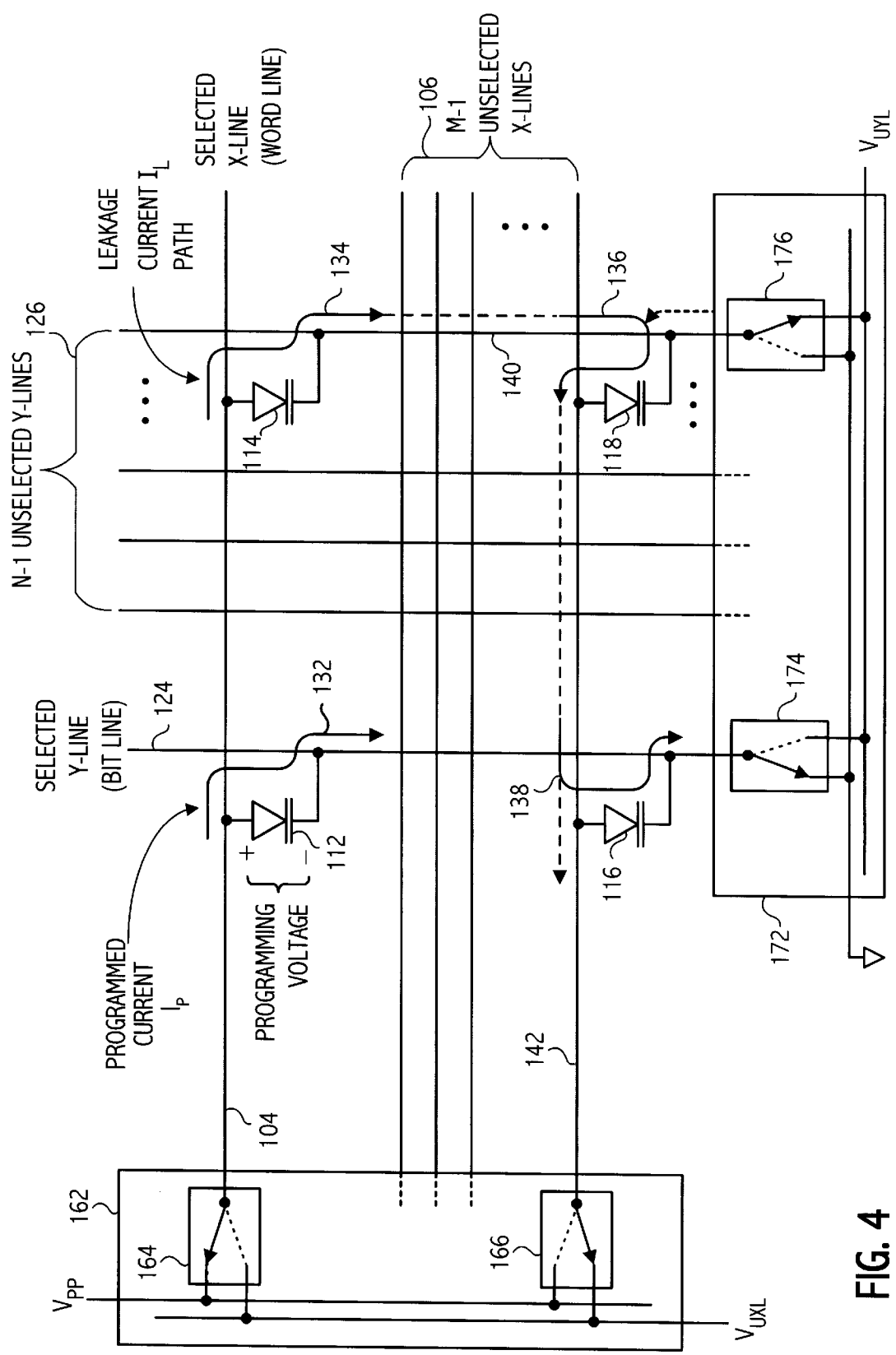
FIG. 4 is an electrical schematic diagram of a passive element memory array whose unselected lines are biased in accordance with an embodiment of the present invention.

Referring now to FIG. 4, a memory array 160 in accordance with the present invention is shown in simplified form applicable for a write mode of operation. The X-line selector 162 provides a respective driver circuit (e.g., drivers 164, 166) for connecting each respective X-line to either a programming voltage $V_{PP}$ or to an unselected X-line bias voltage $V_{UXL}$. Similarly, the Y-line selector 172 provides a respective driver circuit (e.g., drivers 174, 176) for connecting each respective Y-line to either a ground reference voltage or to an unselected Y-line bias voltage $V_{UYL}$.

As before, one particular antifuse memory cell 112 is shown connected between a selected X-line 104 and a selected Y-line 124. To program the memory cell 112, the selected X-line 104 is coupled by driver 164 to the programming voltage $V_{PP}$, and the selected Y-line 124 is coupled to ground by driver 174, thus impressing substantially the entire $V_{PP}$ voltage across the selected memory cell 112. Once programmed, the memory cell becomes dramatically more conductive, which results in a programmed current $I_P$ (labeled as 132) flowing from the $V_{PP}$ voltage source to ground through the now programmed memory cell 112. The magnitude of the programmed current $I_P$ may frequently reach 100 microamps. The magnitude of such a programming voltage source may be 5 to 20 volts, depending upon the structure of the particular memory cell technology incorporated within memory array 100.

Figure 5:
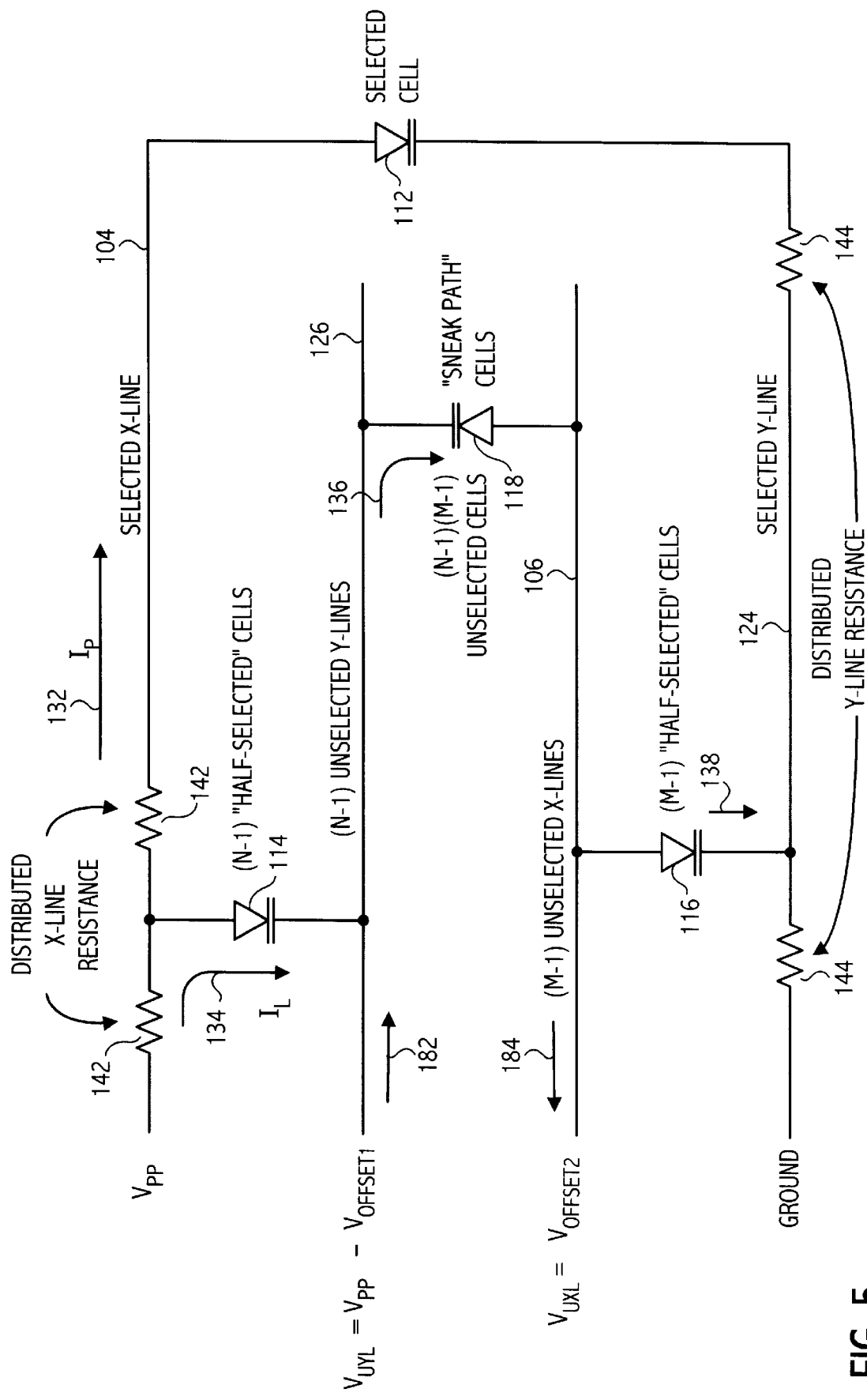
FIG. 5 is a simplified electrical schematic diagram depicting the leakage current through unselected memory cells in the memory array biased as in FIG. 4.

While the memory cell 112 is being programmed, the remaining M−1 unselected X-lines 106 are connected to the $V_{UXL}$ voltage by driver 166, and the N−1 unselected Y-lines 126 are connected to the $V_{UYL}$ voltage by driver 176. A simplified schematic representation of this bias arrangement and the resulting current flow through the various memory cells is shown in FIG. 5. As before, the programmed current $I_P$ is sourced by the programming voltage source $V_{PP}$ and flows along the selected X-line 104, through the selected memory cell 112, and then through the selected Y-line 124 to the ground reference voltage. Similarly, an effective series circuit is still formed between the selected X-line 104 and the selected Y-line 124 by the remainder of the array, which includes the parallel combination of N−1 forward biased memory cells 114, in series with the parallel combination of (M−1)×(N−1) reverse biased memory cells 118, in series with the parallel combination of M−1 forward biased memory cells 116.

In this arrangement, however, an unselected Y-line (UYL) bias voltage $V_{UYL}$ is applied to the unselected Y-lines having a value equal to the $V_{PP}$ voltage minus a first offset voltage $V_{OFFSET1}$, and an unselected X-line (UXL) bias voltage $V_{UXL}$ is applied to the unselected X-lines having a value equal to a second offset voltage $V_{OFFSET2}$ (relative to ground). If the $V_{OFFSET1}$ and $V_{OFFSET2}$ values are chosen carefully, the leakage current in the array, largely influenced by the leakage current through (M−1)×(N−1) reverse biased memory cells 118 having programmed antifuses, is now largely supported by current flow from the $V_{UYL}$ bias voltage source to the $V_{UXL}$ bias voltage source, rather than by current flow from the $V_{PP}$ voltage source to ground. In particular, the bulk of the array leakage current preferably flows from the $V_{UYL}$ bias voltage source (labeled as 182), along the unselected Y-lines 126, through the unselected memory cells 118, along the unselected X-lines 106, and to the $V_{UXL}$ bias voltage source (labeled as 184). As a result, the bulk of the array leakage current is no longer supplied by the $V_{PP}$ programming voltage source. There is less voltage drop along the selected X-line and selected Y-line, and more of the $V_{PP}$ voltage actually reaches and is applied across the selected memory cell.

For many currently practical antifuse memory cells, the breakdown voltage of the antifuse cell ranges from about 5 volts to about 20 volts depending on the thickness of the antifuse layer. A voltage at least as high as the antifuse breakdown voltage must be provided by the $V_{PP}$ voltage and applied across a selected memory cell from anode to cathode (i.e., forward biased). In an exemplary embodiment, a $V_{PP}$ voltage of 10 volts is used for a particular antifuse memory cell technology. The unselected Y-line bias voltage $V_{UYL}$ may be equal to 8 volts, and the unselected X-line bias voltage $V_{UXL}$ may be equal to 2 volts. Consequently, a reverse bias voltage of 6 volts is applied to the unselected memory cells 118, while a forward bias voltage of 2 volts is applied across the half-selected memory cells 114 and the half-selected memory cells 116.

Since the unselected Y-lines are preferably biased to a voltage of $V_{PP}$ minus an offset voltage of 0.5 to 2 volts before the selected X-line is driven to $V_{PP}$, the selected X-line sees a much smaller leakage current 134 and rises faster toward $V_{PP}$. In addition the IR drop (due to the distributed resistance 142) along the selected X-line is smaller than previously achieved, and the voltage applied to the memory cell to be programmed is closer to $V_{PP}$. The programming voltage $V_{PP}$ applied to the X-line is generally slightly above the voltage needed at the memory cell to cause a programming event. It is desirable to have the programming voltage $V_{PP}$ be no higher than necessary because large and high power charge pumps may generate $V_{PP}$ on chip. Also, the semiconductor process requirements are lessened if the high voltages needed for programming need not be quite as high. Alternatively, for a given $V_{PP}$ applied to the circuit, a greater percentage of this voltage actually reaches the selected memory cell, and programming time is reduced since the time required to program the antifuse memory cell decreases rapidly with a increase in the voltage across the memory cell.

Similarly, there are leakage paths through the half selected cells 116 on the selected Y-line 124 to unselected X-lines 106. The unselected X-lines are preferably biased at an offset voltage from 0.5 to 2.0 volts relative to ground before pulling the selected Y-line from a previous unselected bias voltage to ground. The selected Y-line falls rapidly in voltage without having to discharge numerous unselected X lines, and IR drops along the selected Y-line are greatly reduced.

Another advantage of biasing the unselected lines in the array as described is a reduced likelihood of false programming events on the half selected memory cells (i.e., "elements"). The voltage across the half selected cells 114 is limited to the first offset voltage $V_{OFFSET1}$, and the voltage across the half selected cells 116 is limited to the second offset voltage $V_{OFFSET2}$, independent of the pattern that has been programmed previously on memory cells along the selected X-line and selected Y-line. Therefore, the risk that half selected cells can be unintentionally programmed is reduced greatly.

These benefits are achieved over a wide range of values for the two offset voltages $V_{OFFSET1}$ and $V_{OFFSET2}$. It is not necessary for the offset voltages to be so small that negligible leakage current flows from the selected lines during write such as would occur for 0.5 volt offset (for which the half-selected cells are biased at less than their forward diode voltage). A preferred value of each offset voltage is chosen to balance a tradeoff between the reduction of leakage current through half-selected memory cells (as discussed above) against the reduction of the voltage on the very large number of reverse biased diodes (i.e., "unselected cells") in the array between the unselected Y-lines and the unselected X-lines. It is desirable to reduce the voltage stress on the reversed biased memory cells to reduce "sneak path" leakage current and to avoid reliability concerns of the antifuse in these reverse biased cells. This balance is preferably achieved by choosing a value of each offset voltage such that the leakage current through the respective half-selected memory cells is about half the programming current.

Figure 6:
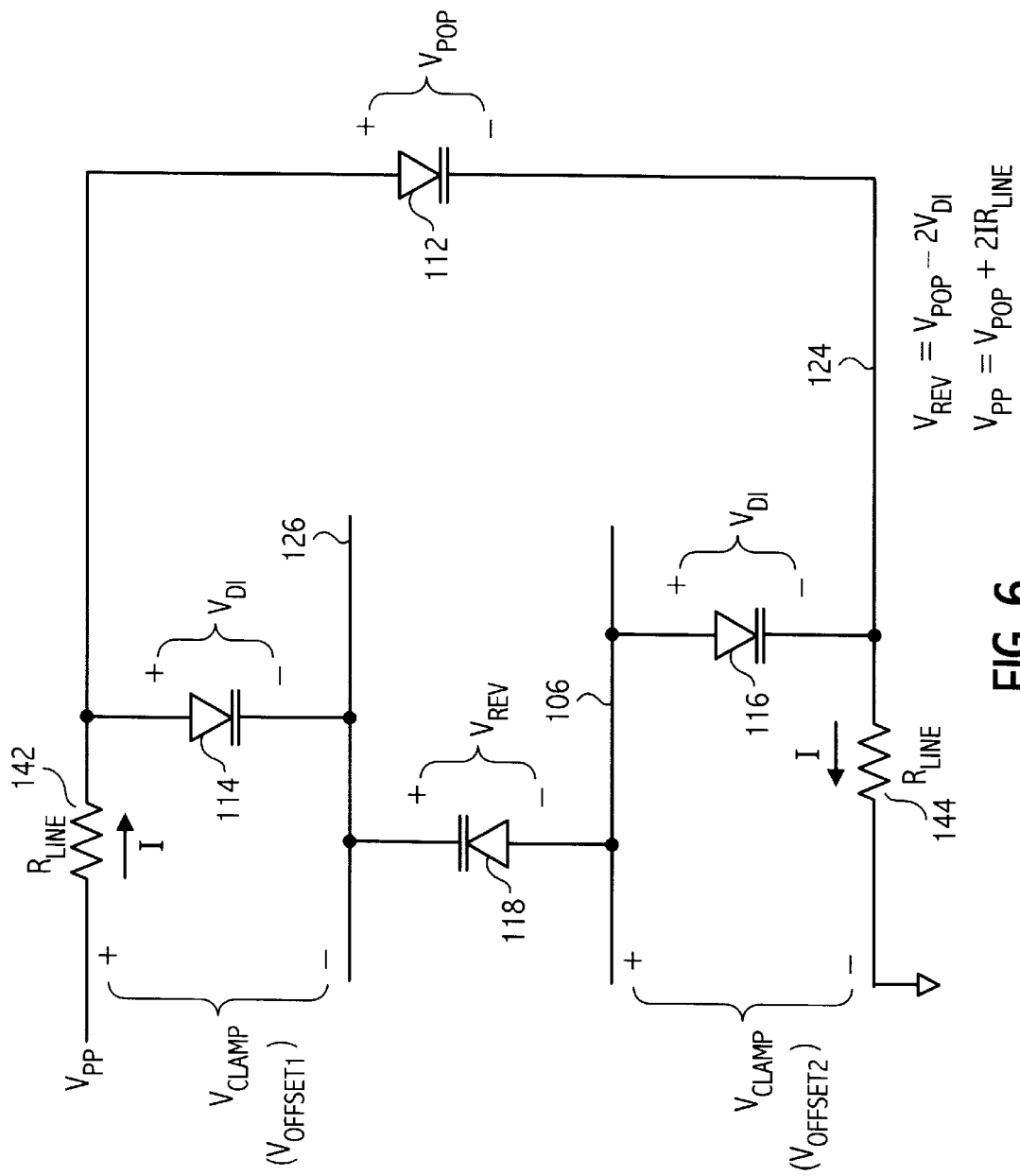
FIG. 6 is a simplified electrical schematic diagram of the memory array biased as in FIG. 4, indicating parameters of the array that are relevant to choosing advantageous values for the various bias voltages.
Figure 7:
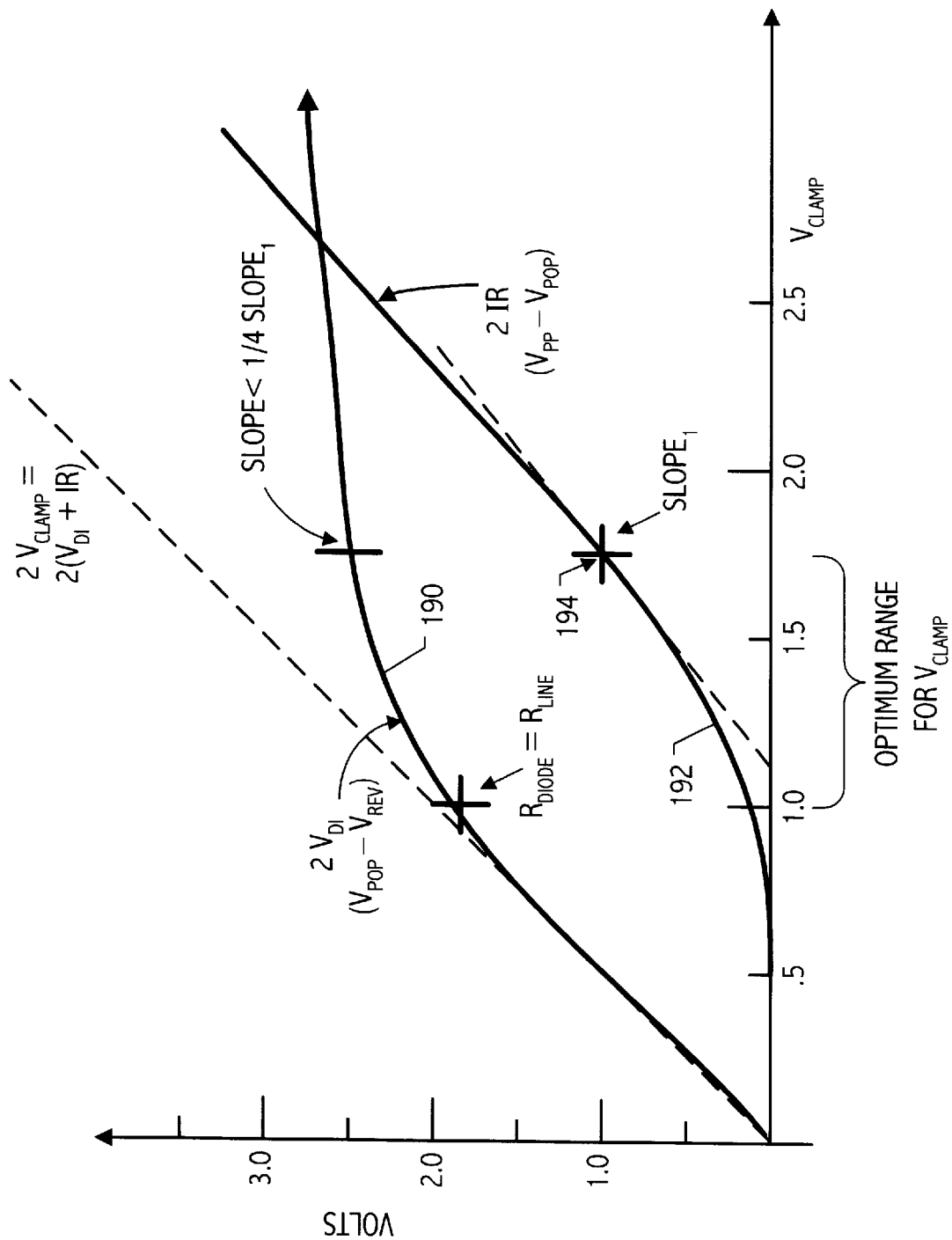
FIG. 7 is a graph depicting two different parameters depicted in FIG. 6.

This outcome for selecting the preferable values of $V_{OFFSET1}$ and $V_{OFFSET2}$ is described in greater detail with regard to FIG. 6 and FIG. 7. For ease of description, the two offset voltages are assumed to be equal in value (and depicted as $V_{CLAMP}$), although such is not necessarily required. Referring now to FIG. 6, The first offset voltage $V_{OFFSET1}$ is chosen to be at least large enough so the diode within the half-selected memory cells 114 starts to turn on. Specifically, as a diode turns on, its differential resistance drops as (1/I). For a $V_{OFFSET1}$ value of about 1.0 volts, the diode resistance $R_{DIODE}$ substantially equals the line resistance $R_{LINE}$ of the selected X-line and Y-line (for an exemplary memory array size). Beyond that value, there is still some benefit in raising $V_{OFFSET1}$ because about half of the $V_{OFFSET1}$ voltage shows up across the diode (i.e., the $V_{DI}$ voltage across the half-selected memory cells 114) and usefully increases the actual programming voltage $V_{POP}$ that reaches the selected memory cell 112. The other half of the $V_{OFFSET1}$ voltage is dropped across the selected X-line resistance and just increases the input voltage requirements for the programming voltage $V_{PP}$. It is undesirable to require the $V_{PP}$ voltage to be any higher than necessary because of semiconductor device voltage limits and attendant reliability concerns. But some additional $V_{OFFSET1}$ voltage is reasonable.

Referring now to FIG. 7, a graph is shown depicting both the voltage drop $V_{DI}$ across the half-selected memory cells 114 and 116, as well as the voltage drop along the selected X-line and Y-line. The sum of the voltage drops (i.e., "$2V_{DI}$") across both the half-selected memory cells 114 and the half-selected memory cells 116 is plotted as the curve labeled 190. The sum of the voltage drops (i.e., "2IR") along both the selected X-line 104 and the selected Y-line 124 is plotted as the curve labeled 192. It is believed that an IR drop of up to about 0.5 volts is an acceptable design region, for typical diodes (labeled as point 194). At this point the slope of the incremental voltage drop across the line resistance is four times the slope of the incremental voltage drop across the diode, and there is little gain in going higher in clamp voltage. Thus, a preferable range for the $V_{OFFSET1}$ and $V_{OFFSET2}$ voltages is from about 0.5 to about 2.0 volts, and more preferably from about 1.0 to about 1.75 volts.

Figure 8:
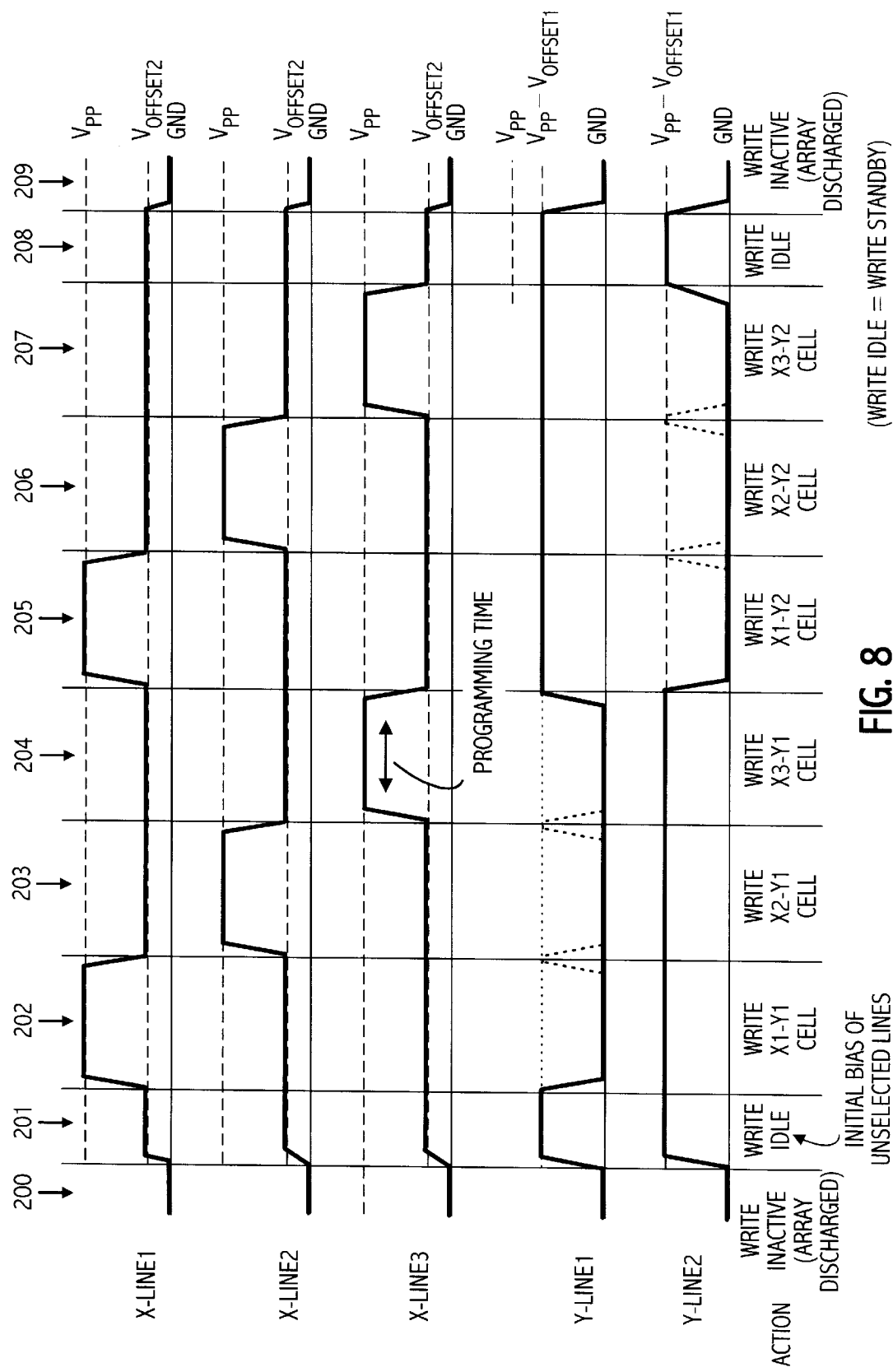
FIG. 8 is a timing diagram illustrating suitable voltage waveforms of various memory array lines when writing several different memory cells within an array.

Referring now to FIG. 8, a timing diagram is shown illustrating suitable waveforms for X-lines and Y-lines when writing six different memory cells within a memory array. At time slot 200, the memory array is held in an inactive state where all lines are grounded. No reading or writing can occur when so biased. At time slot 201, the array is taken into a write standby (or write idle) condition by driving all the X-lines (although only three are shown here) to the unselected X-line bias voltage (e.g., $V_{OFFSET2}$) and by driving all the Y-lines (although only two are shown here) to the unselected Y-line bias voltage (e.g., $V_{PP}-V_{OFFSET1}$). Then, at time slot 202, a single X-line X-LINE1 is driven to the $V_{PP}$ voltage and a single Y-line Y-LINE2 is driven to ground, thereby selecting the memory cell coupled between X-LINE1 and Y-LINE1 and if biased in this condition sufficiently long, thereby programming such selected memory cell.

Time slots 203 and 204 sequence through two other X-lines to program two additional memory cells which are both coupled to Y-LINE1. The Y-LINE1 voltage may remain at ground while the various X-lines are sequenced, or the Y-LINE1 voltage may return to the unselected Y-line bias voltage between each time slot (indicated by the dashed lines). Time slots 205, 206, and 207 sequence through the same three X-lines but a different Y-line to program three additional memory cells. At time slot 208, the memory array is taken back into a write standby condition in which all the lines are "unselected" and biased at the respective unselected bias voltage. Lastly, at time slot 209, the array is discharged and returned to the inactive state. Specific circuits useful for accomplishing such a sequence are provided herebelow.

The description thus far suggests a two-dimensional memory array having a single plane (or level) of memory cells, with a layer of X-lines above (or below) the memory cells, and a layer of Y-lines conversely below (or above) the memory cells. In an advantageous three-dimensional memory array having multiple planes of memory cells, the X-lines of a particular layer are connected to memory cells below and above the X-line layer (except for possibly the last X-line layer), and Y-lines of a different layer are connected to memory cells below and above the Y-line layer. In other words, the X-lines associated with memory cells within a particular memory plane are also associated with other memory cells within a memory plane adjacent to the particular memory plane (if present), and the Y-lines associated with memory cells within the particular memory plane are also associated with other memory cells within a memory plane adjacent to the particular memory plane (if present). The memory cells within such array structures implement vertical "diode stacks," which may be back-to-back diode stacks or serial chain diode stacks. Preferred three-dimensionional memory arrays of passive element memory cells are described in U.S. patent application Ser. No. 09/560,626 by Knall, et al, filed Apr. 28, 2000, and U.S. patent application Ser. No. 09/814,727, by Knall, et al, filed Mar. 21, 2001, both incorporated by reference herein.

In a memory array having one plane of memory cells, the number of unselected memory cells (i.e., "sneak paths" through reverse biased diodes) is $(M-1)\times(N-1)$, as described above. For a large memory array where M is equal to N, this number may be thought of as equal to about $N^2$. In a three dimensional memory array having more than one memory plane of memory cells, there are multiple layers of unselected X-lines and unselected Y-lines, and the number of sneak paths is $2N^2$, $3N^2$, or even $4N^2$, as further described below. Therefore the unselected line biasing of the present invention is particularly valuable in three-dimensional passive element arrays having more than one plane of memory cells.

Figure 9:
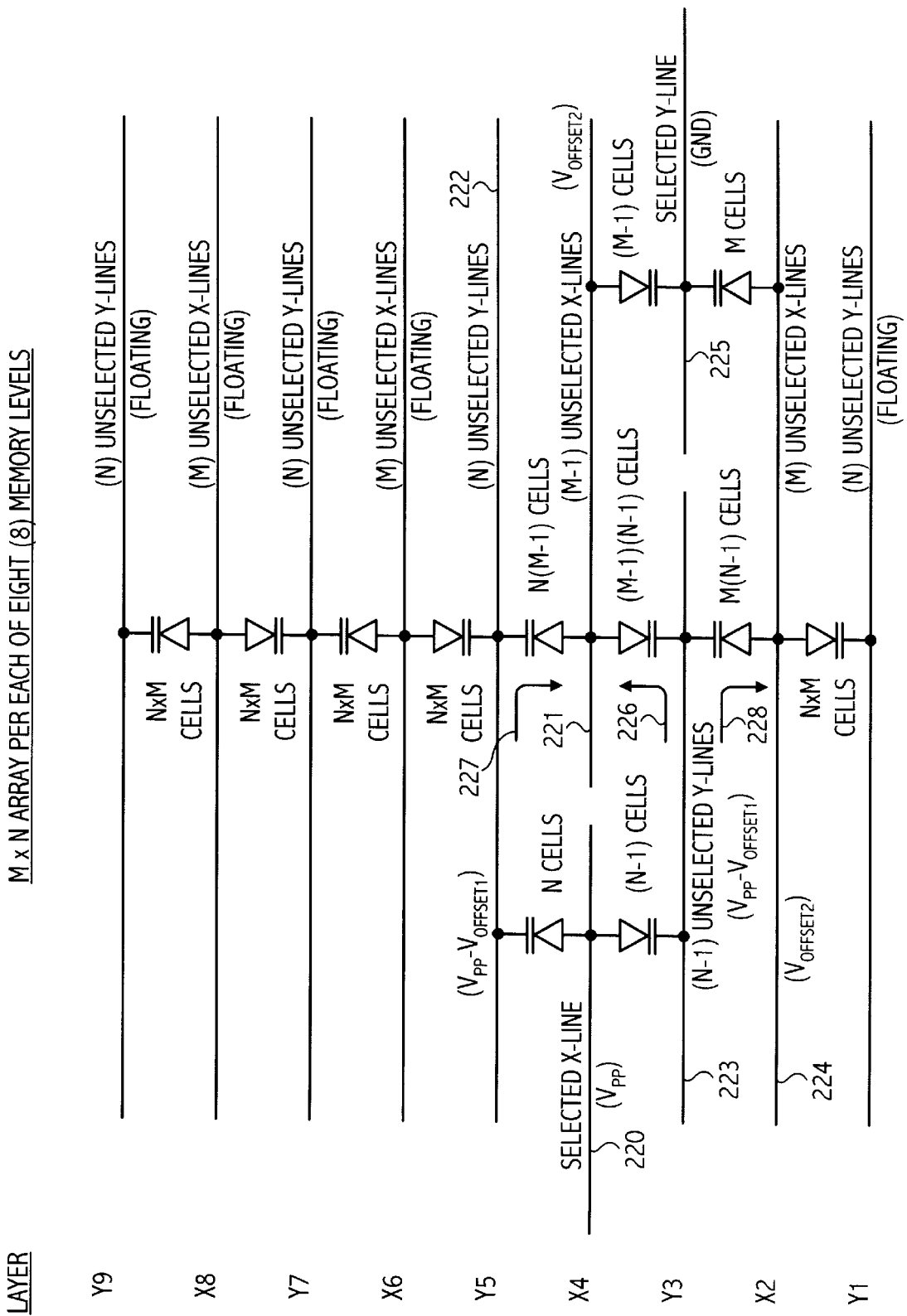
FIG. 9 is a simplified electrical schematic diagram of a three-dimensional memory array illustrating a preferred biasing of array lines on each of the different layers.

FIG. 9 illustrates the biasing of a three-dimensional memory array having eight memory planes (i.e., an 8-layer back-to-back diode stack) tracing the leakage and sneak paths and showing which layers are biased to get the benefit of faster X-line rise time, and reduction of false programming. Nine alternating layers of array lines (i.e., X-lines and Y-lines) are provided for the eight memory planes, one such array line layer above and below each memory plane. The lower-most array line layer is labeled Y1, signifying Y-lines on layer 1. The second layer is labeled X2, signifying X-lines on layer 2, and so forth. Each respective Y-line on layer Y9 is electrically connected to the corresponding Y-line on layer Y1. Other embodiments may use a serial chain diode stack, such as described in "Three-Dimensional Memory Array Incorporating Serial Chain Diode Stack," by Bendik Kleveland, et al, which is being filed on even date herewith.

A selected X-line 220 on layer X4 is biased at $V_{PP}$ and a selected Y-line 225 is biased at ground reference voltage to program a selected memory cell (not shown) coupled therebetween within the X4Y3 memory plane. The unselected X-lines 221 associated with the selected memory plane are biased at $V_{OFFSET2}$ and the unselected Y-lines 223 associated with the selected memory plane are biased at $V_{PP}-V_{OFFSET1}$ as with a two dimensional array. A "sneak path" current 226 flows from the unselected Y-lines 223 to the unselected X-lines 221 through $(M-1)\times(N-1)$ unselected memory cells.

A symmetrical equivalent circuit structure is present above the X4 layer as well, and consequently the unselected Y-lines 222 on the Y5 layer are also biased at $V_{PP}-V_{OFFSET1}$. These unselected Y-lines 222 are associated with a memory plane adjacent to the selected memory plane but are not also associated with the selected memory plane. A "sneak path" current 227 flows from the unselected Y-lines 222 to the unselected X-lines 221 through $(M-1)\times(N)$ unselected memory cells. Additionally, a symmetrical equivalent circuit structure is present below the Y3 layer as well, and consequently the unselected X-lines 224 on the X2 layer are also biased at $V_{OFFSET2}$. These unselected X-lines 224 are associated with a memory plane adjacent to the selected memory plane but are not also associated with the selected memory plane. A "sneak path" current 228 flows from the unselected Y-lines 223 to the unselected X-lines 224 through $(M)\times(N-1)$ unselected memory cells.

In such a three-dimensional memory array, it is possible to leave some of the layers of unselected X-lines and unselected Y-lines floating. For example, the X6 layer is not associated with memory cells within a memory plane adjacent to the selected memory plane, and is preferably left floating. Likewise, the Y7 layer is not associated with memory cells either within a selected memory plane or within a memory plane adjacent to a selected memory plane, and thus the unselected Y-lines within the Y7 layer (i.e., all the Y-lines of the Y7 layer) are also preferably left floating. Each of the unselected X-lines or Y-lines which are not associated with memory cells either within a selected memory plane or within a memory plane adjacent to a selected memory plane, are preferably left floating. As used herein, a "floating" node may be coupled to one or more other nodes, but is not coupled to a bias source.

In an alternate embodiment, the unselected X-lines and Y-lines on all layers may be biased to the $V_{OFFSET2}$ and $V_{PP}-V_{OFFSET1}$ voltages, respectively, and the benefits of lower leakage currents on the selected X-line and selected Y-line are still achieved (e.g., higher programming voltage achieved on the selected memory cell, faster rise times on the selected X-line, etc.). However, each such memory plane contributes an additional sneak path current through N×M unselected memory cells, and such leakage current must be provided by the bias voltage sources. When using this biasing technique, the sneak path current advantageously flows through the connections to the unselected lines of which there are a thousand or more. This current produces negligible IR drops. Prior methods suffered large IR drops in the selected X-line and Y-line because this sneak path current flowed just through the one selected X-line and selected Y-line.

Figure 10:
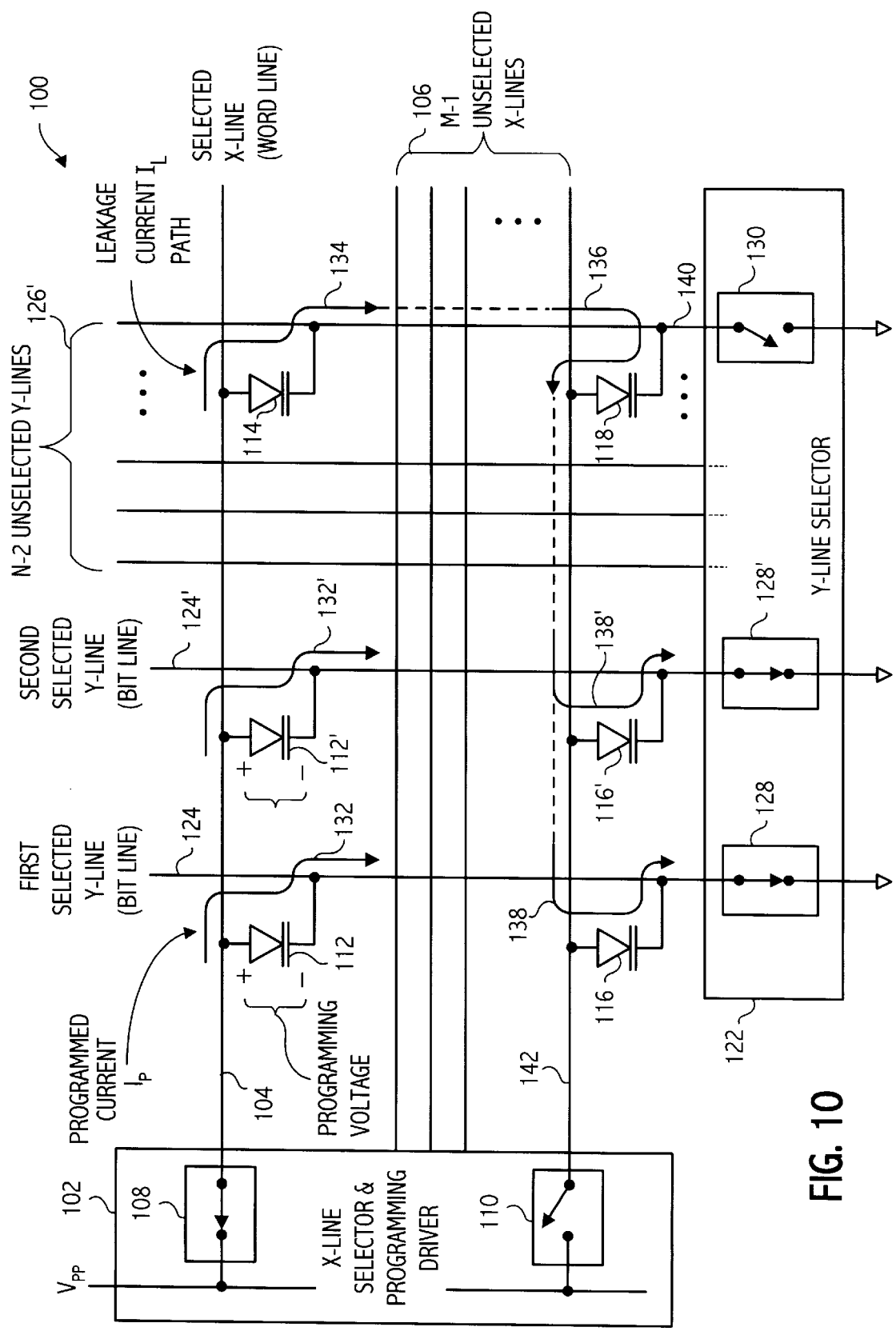
FIG. 10 is an electrical schematic diagram of a passive element memory array having two simultaneously selected memory cells along the same selected X-line during a write operation.
Figure 11:
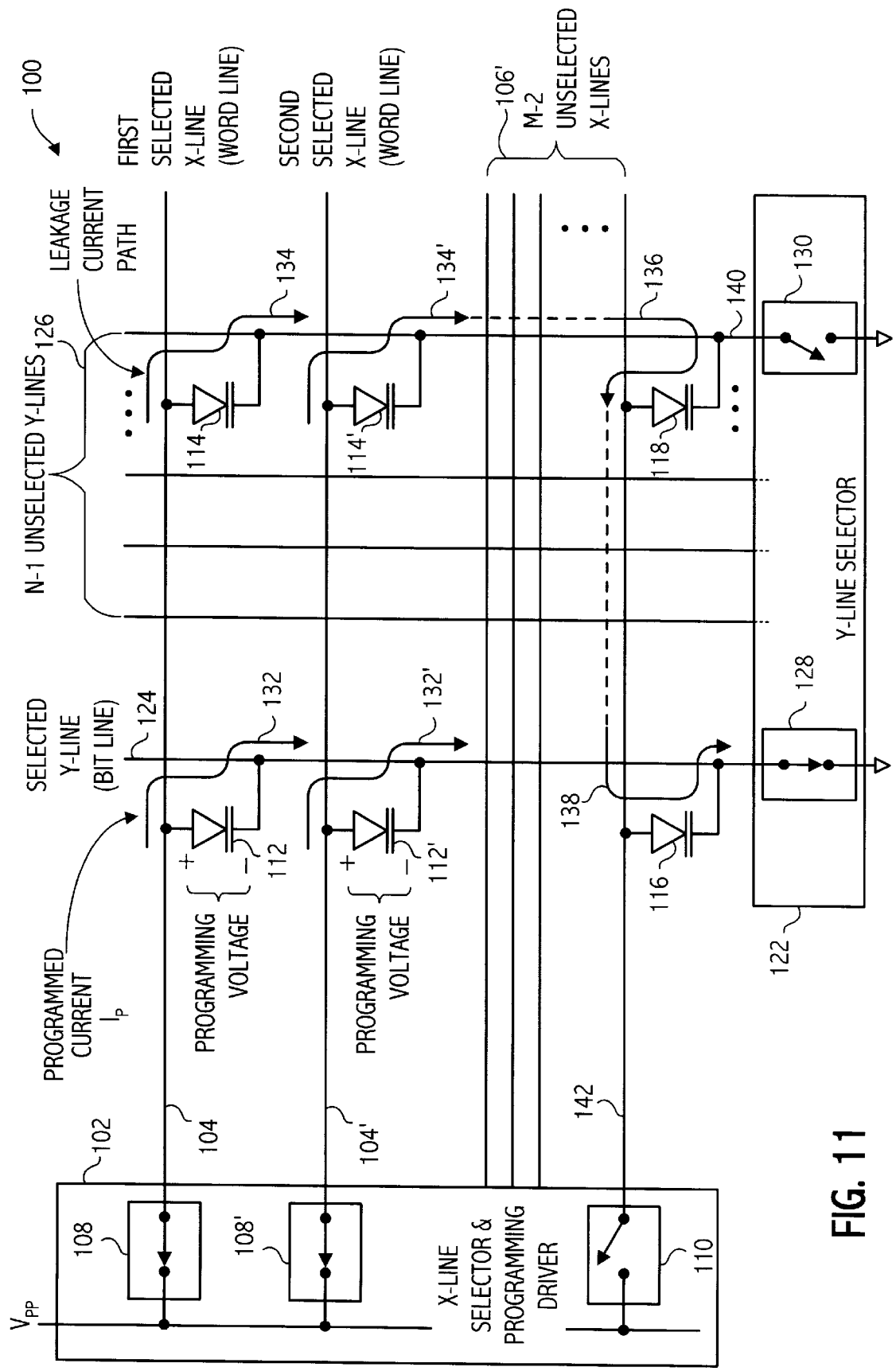
FIG. 11 is an electrical schematic diagram of a passive element memory array having two simultaneously selected memory cells along the same selected Y-line during a write operation.

The above descriptions might be taken to suggest that only one memory cell is simultaneously selected for programming in a memory array. However, the biasing of unselected lines described above is even more helpful in an integrated circuit where multiple memory cells are simultaneously written. If multiple memory cells along a selected X-line are written simultaneously (see FIG. 10, where elements associated with the second selected Y-line are labeled analogously to the first selected Y-line, but with a 'prime' after the numeric designation), the X-line has to provide a programming current as high as the sum of the current through the number of cells to be programmed, so that the first cells that program do not prevent the programming of the other cells. The leakage current from the selected X-line, with no bias applied to unselected lines, is determined by (M−1)×(N−2) reversed-biased unselected memory cells 118. Hence, reducing the leakage current from the selected X-line may be even more helpful than when writing only one cell at a time. The preferred value of the $V_{OFFSET1}$ voltage for such a multiple cell programming situation is in the range of about 0.5 to 1.5 volts. Similarly, if multiple memory cells along a selected Y-line are written simultaneously (see FIG. 11, where elements associated with the second selected X-line are labeled analogously to the first selected X-line, but with a 'prime' after the numeric designation), the Y-line has to sink a programming current as high as the sum of the current through the number of cells to be programmed, so that the first cells that program do not prevent the programming of the other cells. The leakage current from the selected Y-line, with no bias applied to unselected lines, is determined by (M−2)×(N−1) reversed-biased unselected memory cells 118. The preferred value of the $V_{OFFSET2}$ voltage for such a multiple cell programming situation is also in the range of about 0.5 to 1.5 volts.

While a preferred embodiment may employ a $V_{OFFSET1}$ voltage that is substantially equal to the $V_{OFFSET2}$ voltage, such is not required. Both values may be independently optimized for a given situation. Moreover, while it is preferred to use a non-zero value for each offset voltage, either one may be set to zero (essentially eliminating the offset altogether), and a circuit still benefit from the teachings herein. For example, the $V_{OFFSET2}$ voltage may be set to zero, and the unselected X-lines all biased at ground. The unselected Y-lines may still be biased at $V_{PP}-V_{OFFSET1}$ and achieve a reduction in leakage current and an improvement in the risetime of a selected X-line. As stated before, a memory organization may easily be configured to reverse the polarity or directionality of the memory cells connected between X-lines and Y-lines and reverse the voltages of the X-lines and Y-lines. For example, the anode and cathode terminals of a memory cell may be respectively coupled to a Y-line and X-line rather than an X-line and Y-line, in a back-to-back diode stack arrangement. Moreover, an X-line may be coupled to the anode terminal of a memory cell within a memory plane above the X-line and yet be coupled to the cathode terminal of a memory cell within a memory plane below the X-line, as described in greater detail below. Also, no specifically required organizational structure is implied by use of the terms X-line (or word line) and Y-line (or bit line), for the teachings herein may be applied to a wide variety of array organizations by one skilled in the art.

External Source of Programming Voltage

For passive element memory arrays, a high voltage source is required to program the memory cell conductivity, but the high voltage source must also be capable of sourcing a high programming current due to the magnitude of the programming current and also due to the large number of leakage paths in the array. Such a voltage may be generated on-chip by a $V_{PP}$ generator, sometimes frequently implemented as charge pump circuits. Useful charge pump circuits are described in "Charge Pump Circuit," by Mark G. Johnson, et al, filed Dec. 22, 2000, U.S. patent application Ser. No. 09/748,815, which is hereby incorporated by reference. However, the chip area required by such on-chip circuitry to generate the programming voltage source is substantial. If instead, an external source of the $V_{PP}$ programming voltage is provided, several advantages result. First, the area otherwise required for an on-chip $V_{PP}$ generator may be saved, and the power consumed by such a generator is also saved. But in addition, the operating temperature of the integrated circuit during the programming operation decreases as well since the integrated circuit dissipates less power. This lower operating temperature is extremely beneficial for reducing programming time because the leakage current through the reverse biased unselected memory cells (for given bias voltage) also decreases. As a result, the total power consumption is reduced by quite a bit more than just the savings achieved by removing the $V_{PP}$ generator circuit.

A memory device compatible with standard media formats may be provided which cannot be unintentionally written because a high enough voltage is not present on-chip in such an environment. The data programmed in the memory array is protected and the device can be used in play mode. Such a configuration may not be desirable if being able to write data in the end user device is desired. But such a configuration is useful where an end user wants a lower cost device to play prerecorded data such as traditional video and music store products. When such a device is programmed, it is capable of being read with much lower voltages, such as conventional CMOS technology voltage levels of between 1.5 volts to 3.3 volts. Therefore the voltages applied to the X-lines and Y-lines when reading are so low the memory cells are not at risk of being changed even if accessed repeatedly. The data programmed in the memory array is protected and the device can be used in play mode in equipment that follows certain industry standards that have no high voltage supplies.

Yet another advantage is achieved by removing the $V_{PP}$ generator circuit. A semiconductor process must be designed to reliably tolerate the highest voltages and currents conveyed anywhere on the integrated circuit, usually with some degree of margin. When a charge pump style circuit is implemented, there are usually certain circuit nodes that must rise to voltages even higher than the desired output voltage of the generator circuit, and the semiconductor process must tolerate these higher voltages. In addition the variability of the generator circuit and its pumping characteristics usually limit the highest achievable $V_{PP}$ voltage to several volts below the voltage limit of the semiconductor technology. But if the high voltage is received from an external (i.e., off-chip) source, the $V_{PP}$ voltage can be closer to the voltage limit of the semiconductor technology. Since the time to program an antifuse memory cell typically decreases by a factor of ten or more with a volt change in the programming voltage, much faster programming may be accomplished. Alternatively, for a given voltage necessary to program a particular memory cell technology, the overall voltage requirements of the semiconductor technology may be relaxed. This may allow an even greater savings in integrated circuit area, as the spacing between various on-chip structures may be reduced. Preferably, the programming voltage received from an external voltage source is the highest voltage conveyed anywhere in the chip.

Figure 12:
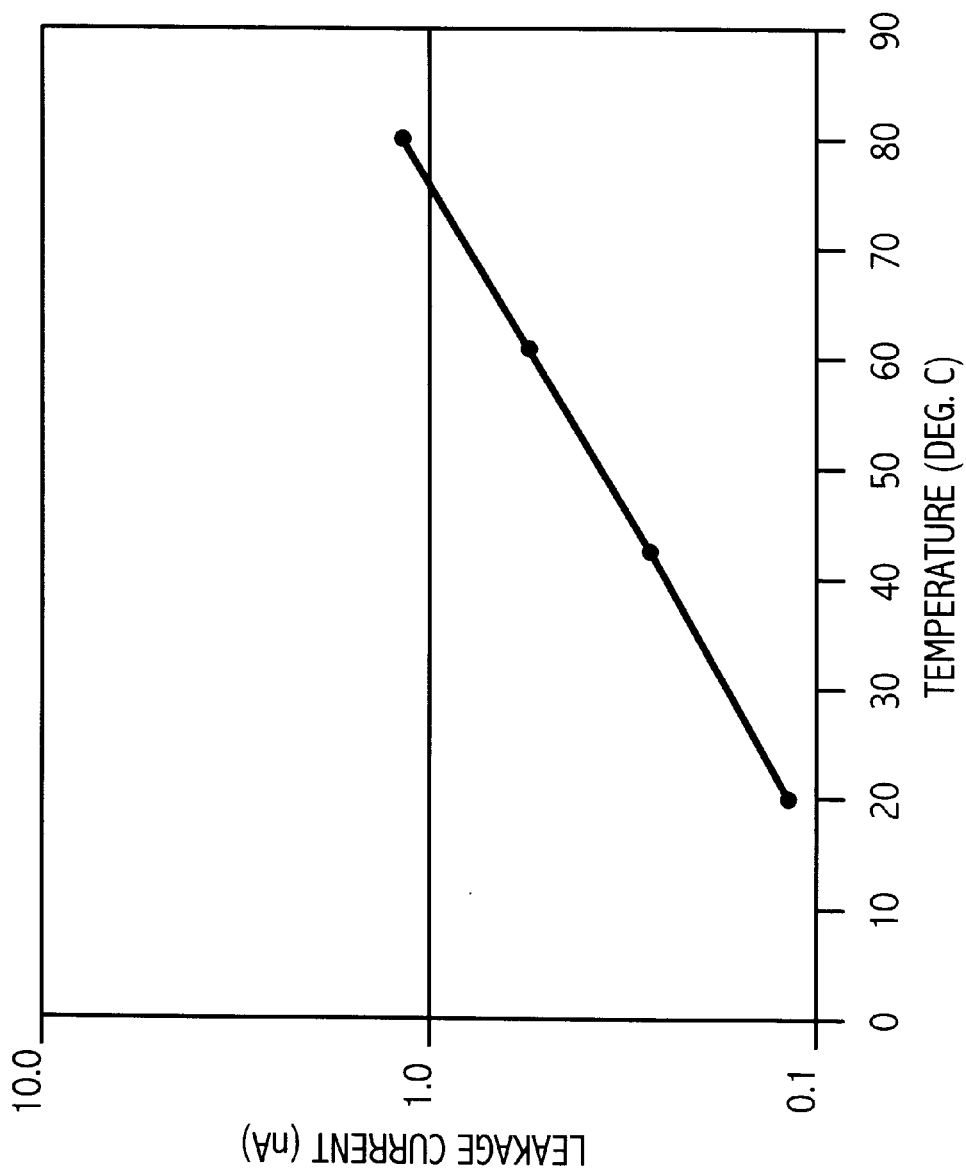
FIG. 12 is a graph depicting leakage current through a reverse-biased memory cell as a function of temperature.

In preferred embodiments, these benefits are achieved by providing high-voltage biases partially from an external voltage source and partially by on chip circuitry. The high voltage bias may easily draw a current of about one to several milliamps while writing high density three-dimensional antifuse memory arrays because of the large number of leakage paths through poor quality reverse biased diodes which act as the highly asymmetric steering element in the memory cells. About 60% of the write power is removed from the chip and dissipated in off chip circuitry by removing the otherwise required on-chip $V_{PP}$ voltage generator. Surprisingly, this results in a 90% or more reduction in the on-chip write power and a corresponding significant reduction of operating temperature of the chip. FIG. 12 depicts the leakage current through a reverse-biased diode (corresponding to an unselected memory cell) as a function of temperature, for a given bias voltage across the diode. As can be seen in the figure, the cooler temperature results in significantly less diode leakage current. For typical integrated circuit packages, the leakage current drops to less one quarter its original value. Therefore, the on-chip write power may easily drop to 10% of the original power, rather than just 40%.

Figure 13:
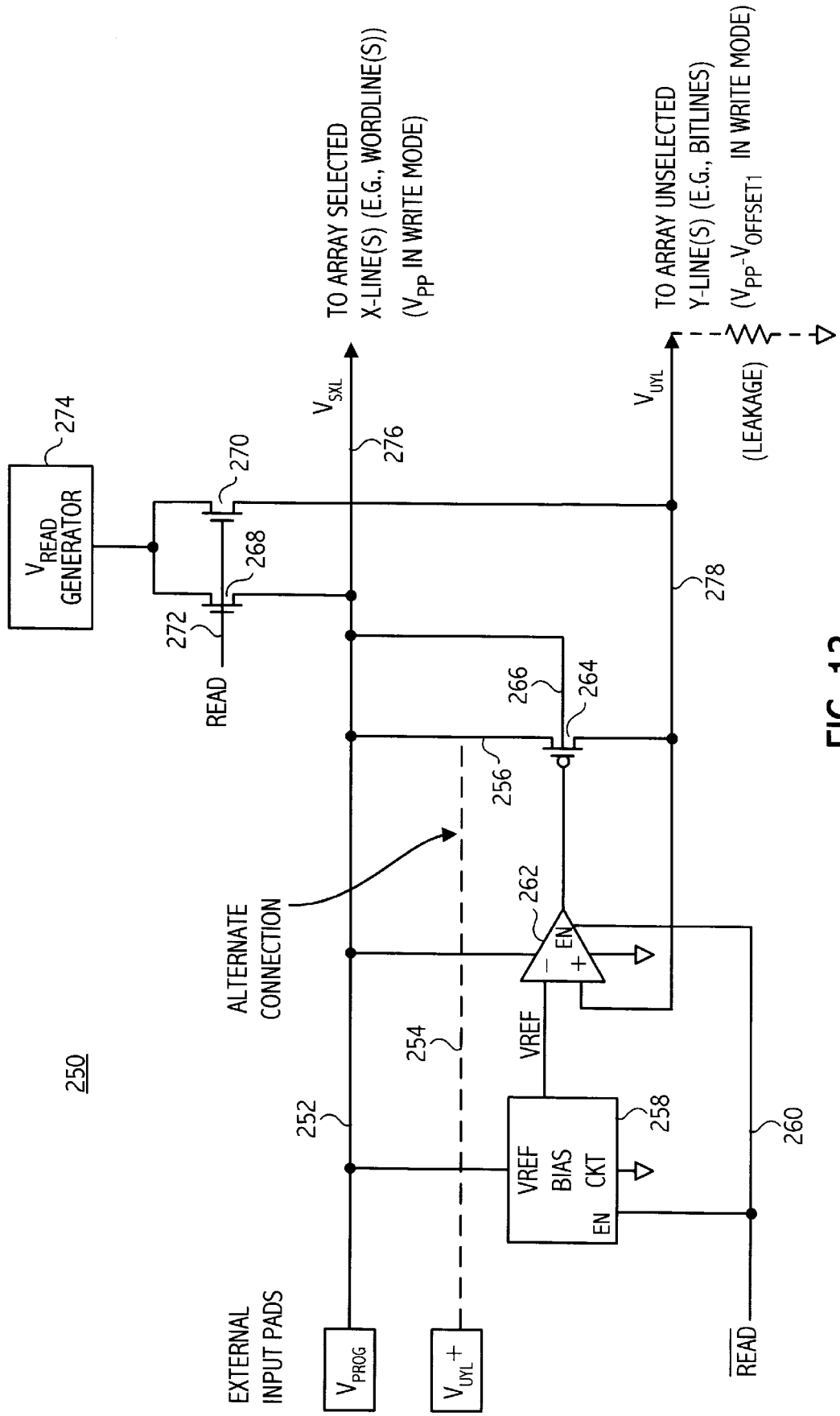
FIG. 13 is an electrical schematic diagram of a bias generation circuit useful for one aspect of the present invention.

FIG. 13 shows a preferred bias generation circuit 250 that receives an externally-provided $V_{PP}$ voltage (labeled as $V_{PROG}$) which is used during a write (i.e., programming) operation as the high voltage supply for the selected X-line, and is indicated as the selected X-line voltage $V_{SXL}$. The circuit 250 also includes a voltage regulator circuit including a $V_{REF}$ bias circuit 258, an amplifier circuit 262, and a P-channel series pass transistor 264. This voltage regulator circuit generates the $V_{UYL}$ bias voltage for the unselected Y-lines having a value equal to a particular offset voltage below the $V_{PP}$ voltage. Even though a large current may flow through the transistor 264, the power dissipation is not excessive because the voltage dropped across the transistor 264 is typically only about one volt. If the offset voltage between the $V_{PROG}$ voltage and the desired $V_{UYL}$ voltage results in too much power dissipation in transistor 264, an alternative implementation receives a second externally-provided voltage source $V_{UYL}+$ that is lower in magnitude than the $V_{PROG}$ voltage but enough higher than the desired $V_{UYL}$ voltage to allow the series regulator to function properly.

The $V_{REF}$ bias circuit 258 and the amplifier circuit 262 are powered by the $V_{PROG}$ voltage source. The $V_{REF}$ bias circuit 258 generates a $V_{REF}$ voltage reference, which is coupled to an inverting input of the amplifier circuit 262. The $V_{UYL}$ voltage is coupled to a non-inverting input of the amplifier circuit 262 to generate on the amplifier output a gate control signal for the series-pass transistor 264.

In a read mode, the high voltage $V_{PROG}$ voltage is not externally-provided to the integrated circuit, and both the $V_{REF}$ bias circuit 258 and the amplifier circuit 262 are disabled by an enable signal $\overline{READ}$ (which preferably, but not of necessity, is low during the read mode). Both the $V_{REF}$ bias circuit 258 and the amplifier circuit 262 are implemented so that all current paths from the $V_{PROG}$ node to ground are interrupted when the circuits are disabled, using any of the many techniques well known in the art. A read bias voltage $V_{RED}$ is generated by the bias circuit 274, and during a read operation, this $V_{READ}$ voltage is coupled to both the $V_{SXL}$ node 276 and the $V_{UYL}$ output node 278 by respective N-channel transistors 268 and 270 gated by a READ enable signal.

The circuit shown avoids forward biases from P diffusions to N well regions, and leakage current from the $V_{PROG}$ node to ground during read mode. Special care to avoid these detractions in the circuit implementation is needed because the $V_{PROG}$ voltage (or $V_{SXL}$ voltage) is not always the highest voltage on the chip. In read mode, the $V_{PROG}$ node is not driven to a high voltage, and is not necessarily even above the regular $V_{DD}$ power supply voltage of the chip (from which $V_{DD}$ supply most circuits are powered). Indeed the voltage desired on the selected X-line and the unselected Y-lines in read mode are preferably both equal to one another and preferably at a value of about 1.5 volts to 2.5 volts. Hence, the unselected memory cells on the X-line (e.g., word line) do not produce a leakage current to unselected Y-lines (e.g., bit lines).

As indicated in FIG. 13, the $V_{PROG}$ voltage is also the bias of the N-well region of PMOS transistor 264. In a write mode, the $V_{PROG}$ voltage is preferably the highest voltage conveyed anywhere on the chip, therefore no P diffusion regions in the series-regulator circuit exceed the supply voltage to these circuits. In a read mode of operation, the $V_{PROG}$ node is not connected to the external high voltage. Rather, the $V_{PROG}$ node is connected to a $V_{READ}$ voltage from the on-chip read bias generator 274. This $V_{READ}$ voltage is not the highest voltage on chip. However, the P regions are still not forward biased. Since the $V_{READ}$ voltage is connected to both the source terminal and the drain terminal of transistor 264, the P type source and drain regions and the N well for transistor 264 are all at the same voltage. In read mode the gate voltage on transistor 264 is not important since no current flows through the transistor 264 (since its source and drain terminal are already connected to the same voltage). In a preferred embodiment the desired value of the $V_{READ}$ voltage is sufficiently below the $V_{DD}$ voltage that transistors 268 and 270 may be implemented as regular N-channel transistors or as low-threshold voltage N-channel transistors, and adequately couple the $V_{READ}$ voltage to both the $V_{SXL}$ output node 276 and the $V_{UYL}$ output node 278. By using an NMOS implementation rather than a CMOS implementation (i.e., both NMOS and PMOS transistors) ensures that there are no P-regions forward biased to N-wells.

In the alternate embodiment utilizing an externally provided $V_{UYL}+$ voltage, there are two external high voltage supplies coupled to the chip. The $V_{PROG}$ voltage is preferably applied to the chip before or simultaneously with the $V_{UYL}+$ voltage, so that the $V_{PROG}$ voltage is always the higher of the two external voltages, even during power up. The connection of the N-well of transistor 264 to the $V_{PROG}$ voltage ensures that its P-type source and drain regions do not forward bias to its N-well regions during write mode.

In other embodiments, additional external voltage inputs may be advantageously employed to provide other bias voltages and further reduce power dissipation.

Safe Discharge of Memory Array Lines

In a dense three-dimensional memory array there are many layers of X-lines and Y-lines stacked atop one another within the array. Efficiently writing and reading such a memory array preferably involves biasing the unselected lines within only a subset of the total number of layers, leaving the remaining layers floating at an uncontrolled voltage (as described above, particularly in regards to FIG. 9). Of the layers that are actively biased at a voltage, generally any one layer is biased at a voltage that is different from its adjacent layers.

Figure 14:
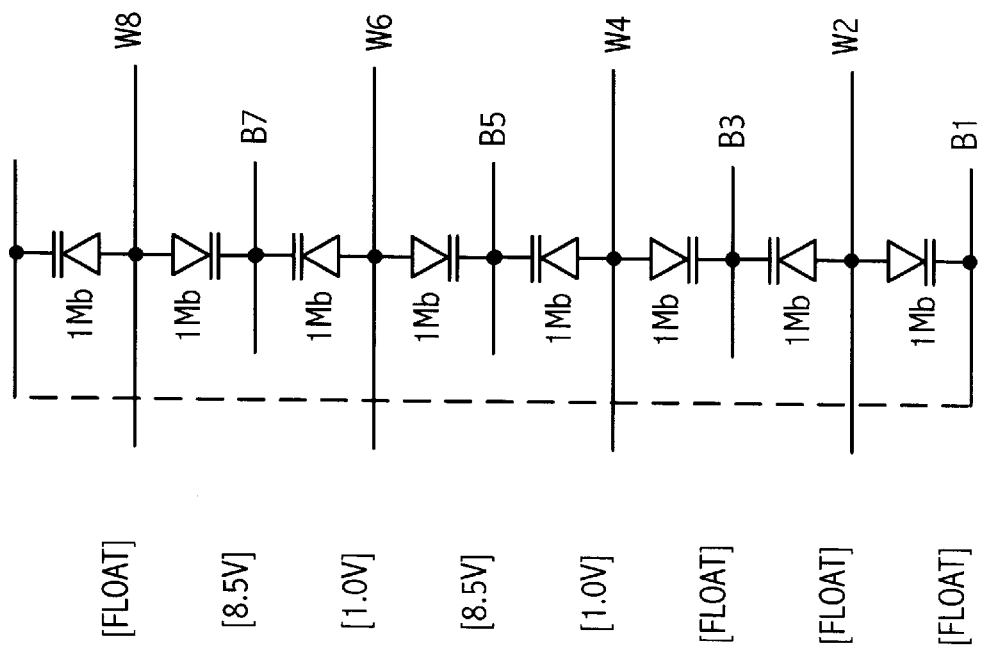
FIG. 14 is a simplified electrical schematic diagram of an 8 MB three-dimensional memory array illustrating a preferred biasing of array lines on each of the different layers.

Referring now to FIG. 14, consider a 1 MByte memory array, constructed from eight individual vertically-stacked 1 Mbit memory planes. The bottom-most layer of array lines are assumed to be bit lines, and this layer is labeled B1 accordingly. The next layer is word lines and is labeled W2. The layers alternate between bit line layers and word line layers, up through layer W8. The top-most memory plane is formed between the W8 layer and a ninth layer of bit lines that are each respectively connected to a corresponding bit line on the B1 layer (indicated by the dashed line). In this example, assume that a memory cell in the W6-B5 plane is being written. One W6 word line and one B5 bit line are driven to 9.5 volts and 0 volts, respectively, to program that memory cell (e.g., write a logic 0 into that cell). All other unselected word lines and bit lines are biased as shown in FIG. 14. The unselected W6 and W4 word lines are biased at 1.0V, and the unselected B5 and B7 bit lines are biased at 8.5V. There is a leakage path created through the reverse biased memory cells coupled between the 8.5 volt and 1.0 volt bias voltages. For this reason, the remaining layers are left floating.

As can be appreciated, therefore, writing a memory cell on a single selected memory plane, for this example, involves biasing 4 layers and leaving the other 4 layers floating. The 4 biased layers are those associated with m emory cells within the selected memory plane and those associated with memory cells in memory planes adjacent to the selected memory plane. In this context, an adjacent memory plane is one sharing array lines, so that the B1-W2 memory plane is adjacent to the B1("B9")-W8 memory plane, even though structurally the memory cells of these two memory planes are separated by six other memory planes.

Because of power limitations on an integrated circuit, a memory array cannot be arbitrarily large. Thus, a memory of capacity greater than 1 Mbyte is preferably implemented using multiple 1 MByte arrays (sometimes called "sub-arrays"). Each array dissipates power when activated, and therefore likely that only one array will be active at any given time. The other non-activated arrays are preferably maintained into a zero power state. For example, a 64 MByte memory may have sixty-four 1 MByte memory arrays, with 1 active and 63 others inactive at any given time. The word lines and bit lines of all unselected arrays are preferably maintained at an inactive voltage such as ground or a voltage very close to ground (refer again generally to the description regarding FIG. 8). This reduces power dissipation as well as ensures that no memory cell within an unselected memory array is unintentionally programmed or even stressed to moderate voltages.

Figure 16:
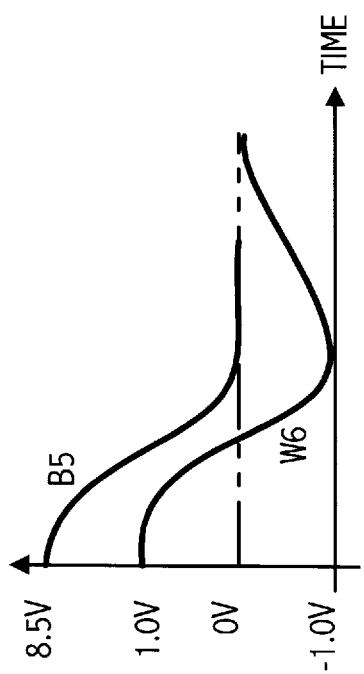
FIG. 16 is a waveform diagram representing the voltage waveforms of the two memory layers illustrated in FIG. 15.
Figure 15:
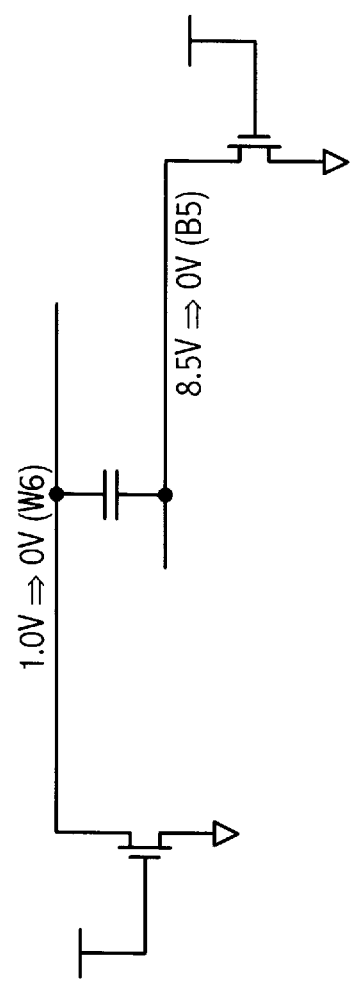
FIG. 15 is a simplified electrical schematic diagram representing a negative coupling which may occur when discharging a three-dimensional memory array biased as illustrated in FIG. 14.

The voltages indicated on FIG. 14 correspond to the memory array in a write standby state. When the array is driven from this write standby state to a write inactive state, the charge on each layer must be discharged to ground to accomplish driving the voltage of each layer to ground. However, in a memory array such as a passive element memory array, the capacitive coupling between adjacent layers is large due to the memory cell capacitance as well as the interconnect coupling between the word line and bit line themselves. As a result, when a biased bit line layer (for this example, B5 and B7) is driven from 8.5V to 0V (see FIG. 15), it will capacitively couple significantly to the adjacent word line layer and invariably force the adjacent word line layer below ground (as shown in FIG. 16). This excursion below ground may be large enough to cause latchup in the word line layer pulldown device, the effects of which are extremely detrimental.

Such excursions below ground may be avoided by discharging the capacitance between layers so that their word lines and bit lines are driven or "equilibrated" to nearly the same voltage. The previously-biased layers may then be safely discharged to ground without coupling adjacent layers below ground.

Figure 17:
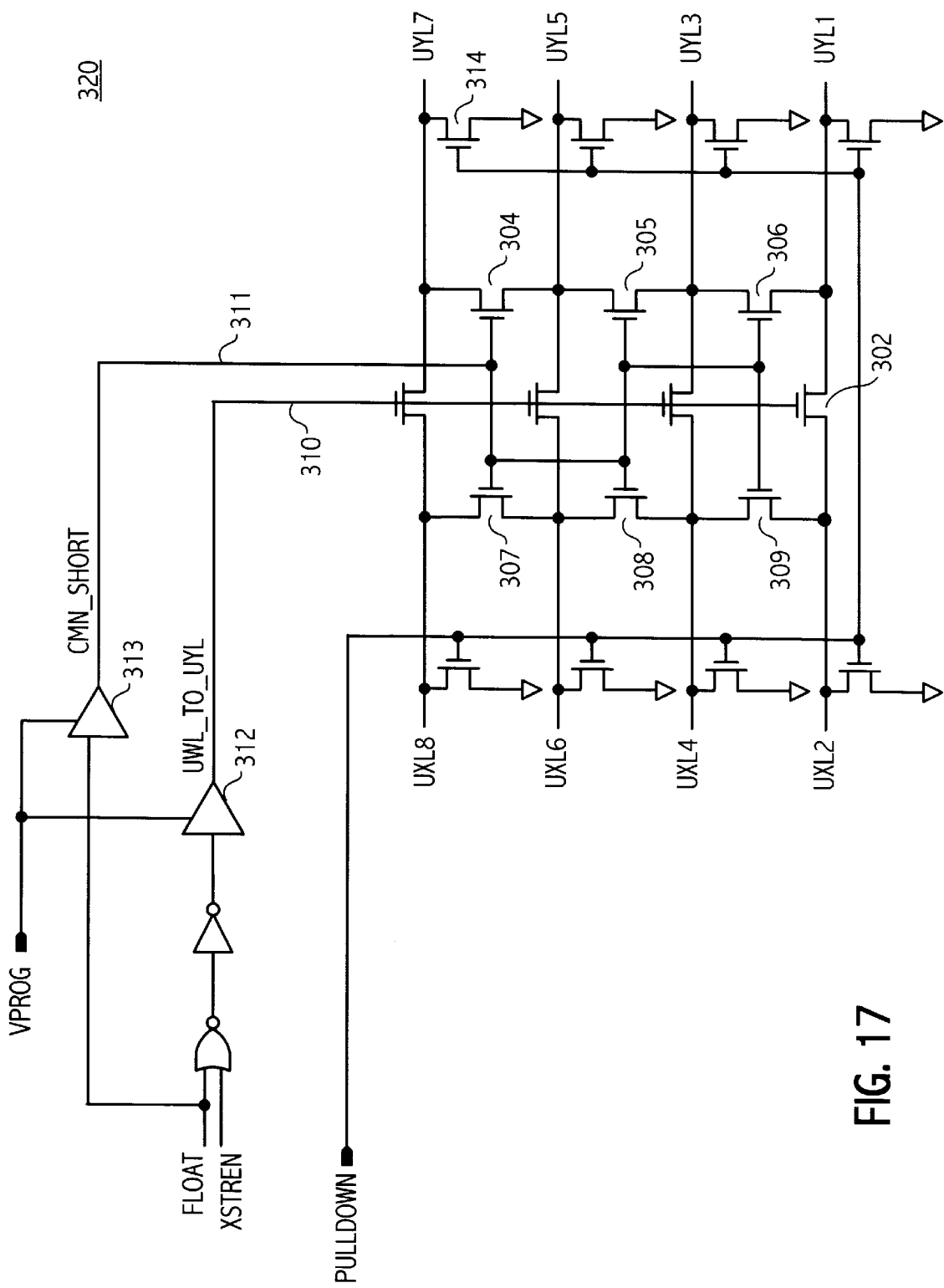
FIG. 17 is an electrical schematic diagram of a discharge circuit in accordance with one aspect of the present invention.

Referring now to FIG. 17, a discharge circuit 320 is depicted. A group of bias nodes UYL1, UXL2, UYL3, UXL4, UYL5, UXL6, UYL7, and UXL8 provides a bias voltage to which the unselected lines of each corresponding layer Y1, X2, Y3, X4, Y5, X6, Y7, X8 are coupled during the write mode. The particular bias voltage for each layer depends upon which memory plane is selected for write, and thus depends upon the organization of the memory array and the address of the selected memory cell(s). A driver circuit for each X-line on a particular layer is preferably configured to couple the X-line, if unselected, to the unselected bias voltage conveyed on the unselected bias voltage node UXLi (where i=2, 4, 6, or 8) for the particular layer. The X-line driver circuit is also configured to couple the X-line, if selected, to a selected bias voltage conveyed on a selected bias node (not shown). Similarly, A driver circuit for each Y-line on a particular layer is preferably configured to couple the Y-line, if unselected, to the unselected bias voltage conveyed on the unselected bias voltage node UYLi (where i=1, 3, 5, or 7) for the particular layer. The Y-line driver circuit is also preferably configured to couple the Y-line, if selected, to the ground reference voltage.

Transistors 304, 305, and 306 are provided to couple together each of the four bias nodes for the unselected Y-lines (UYL1, UYL3, UYL5, and UYL7). Transistors 307, 308, and 309 are provided to couple together each of the four bias nodes for the unselected X-lines (UXL2, UXL4, UXL6, and UXL8). Each of these transistors is gated by a CMN__SHORT signal conveyed on node 311. In addition, a group of four transistors (such as 302) couple an unselected Y-line bias node to an unselected X-line bias node, in four pairs, when gated by a UXL__TO__UYL signal conveyed on node 310. These transistors thus far form a first circuit which essentially shorts all the X-lines on each of the four X-line layers and all of the Y-lines on each of the four Y-line layers together, allowing the aggregate system to charge share to a common voltage, somewhere between the X* and Y* (i.e., the W* and B*) bias voltages. Level shifters 312 and 313 powered by the $V_{PROG}$ voltage ensure that the active level of the CMN__SHORT and UXL__TO__UYL control signals are high enough to fully equilibrate the various bias voltages together.

Figure 18:
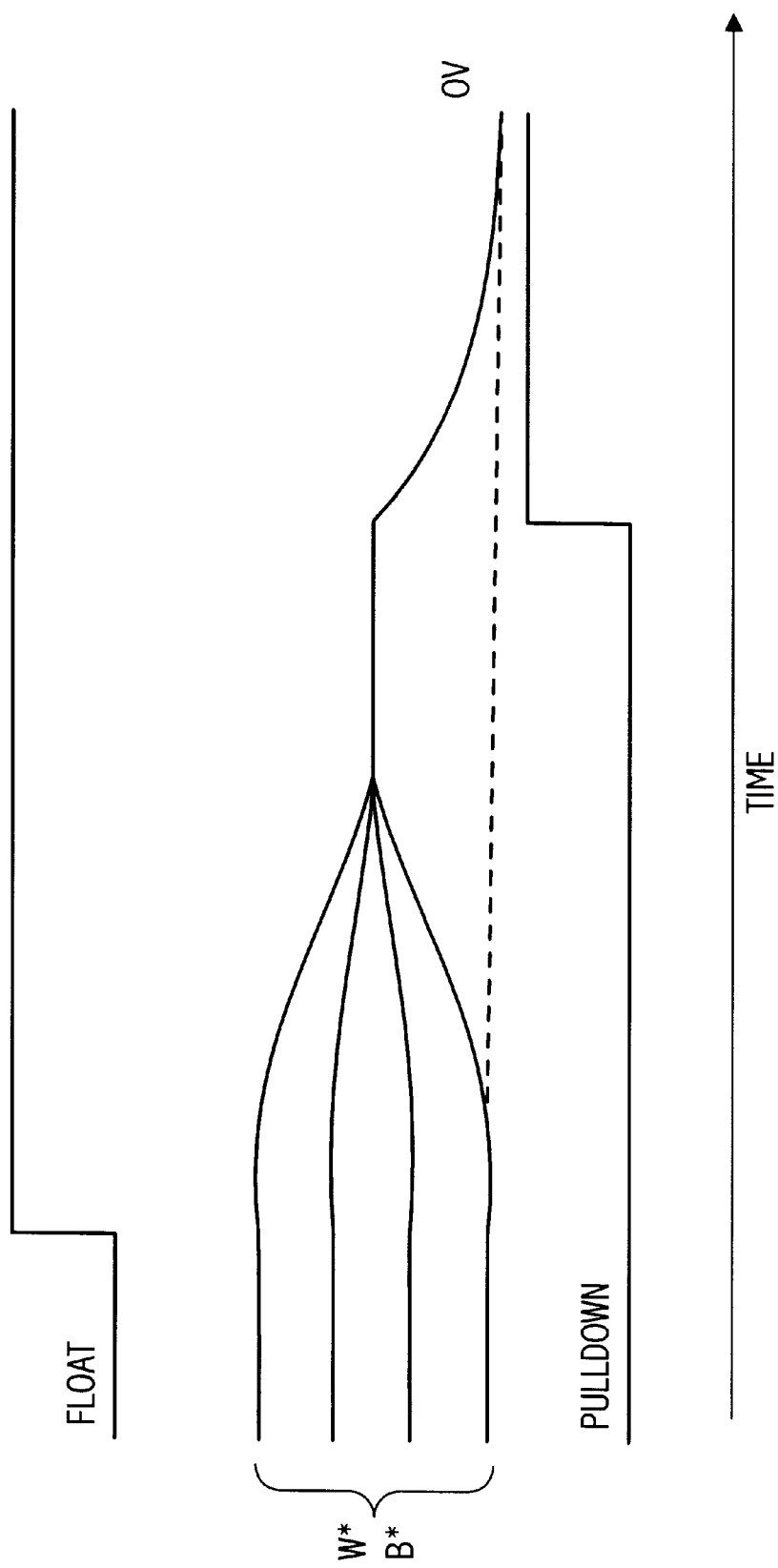
FIG. 18 is a waveform diagram representing the voltage waveforms of various circuit nodes illustrated in FIG. 17.

The discharge circuit 320 also includes eight transistors (such as 314) to discharge each of the eight unselected line bias nodes. These eight transistors form a second circuit to drive all the unselected X-lines and Y-lines to ground when gated by a PULLDOWN signal, which may be enabled after equilibrium has been substantially reached. This ensures that both sides of the large array capacitance are at the same voltage, thus pulling both sides to ground will not force any transistor source or drain terminal below ground. A timing diagram illustrating the voltages achieved when discharging a memory array in this manner is shown in FIG. 18. The FLOAT signal causes the bias voltage generators to float their respective outputs (not shown) and equilibrates the eight bias voltage node together. Later, the PULLDOWN signal discharges all eight bias nodes to ground.

Figure 19:
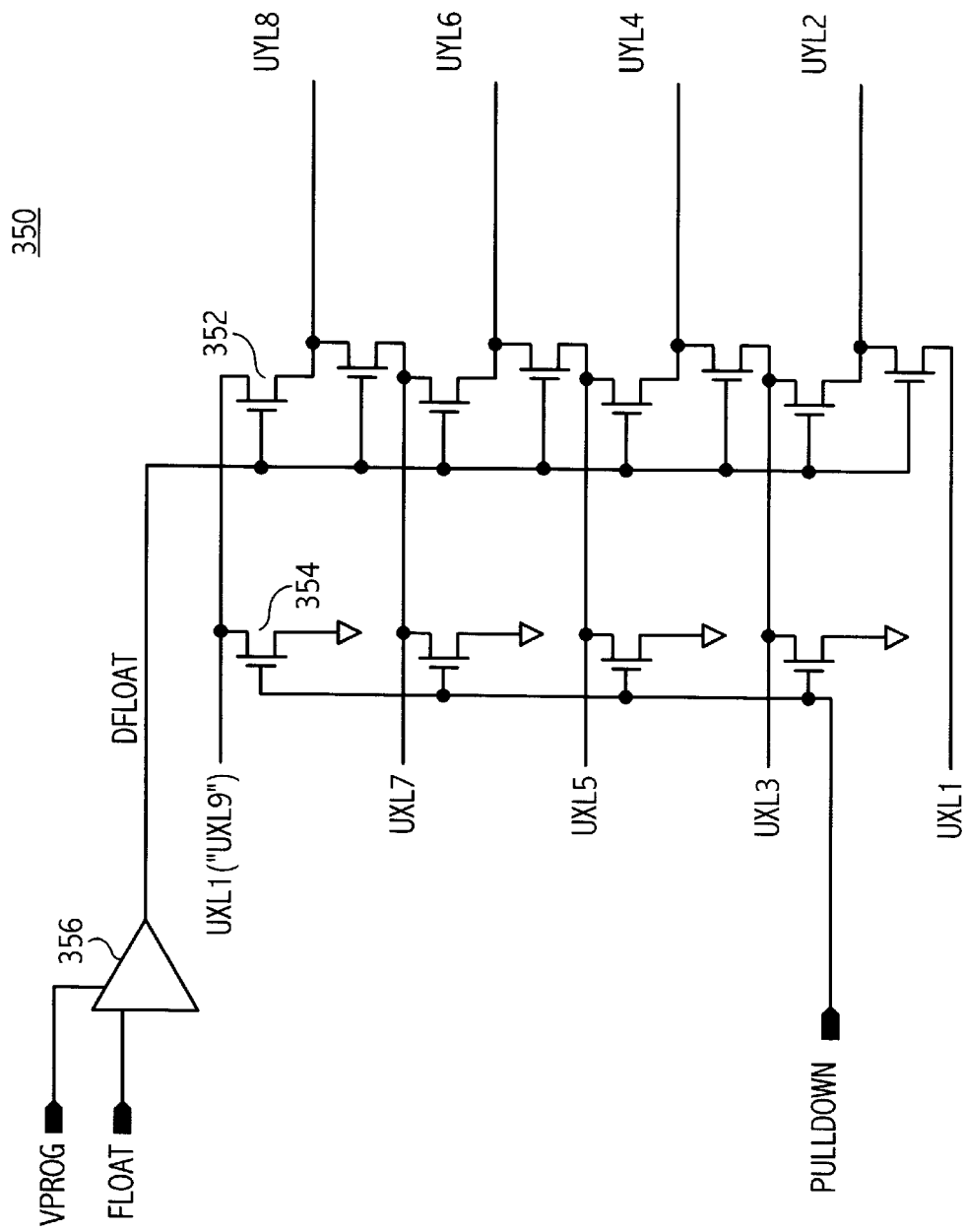
FIG. 19 is an electrical schematic diagram of a discharge circuit in accordance with one aspect of the present invention.

A preferred embodiment of a discharge circuit 350 is shown in FIG. 19 which safely discharges all eight bias voltage nodes with fewer transistors. The discharge circuit 350 also assumes a preferred "word-line first" arrangement of the memory array, to reduce coupling to bit line layers from circuits or interconnect wiring above or below the array. A first group of transistors (one of which is labeled 352) short together the unselected bias voltage nodes for all eight layers when gated by a DFLOAT signal. A level shifter 356 powered by the $V_{PROG}$ voltage ensures that the active level of the DFLOAT signal is high enough to fully equilibrate the various bias voltages together. A second group of transistors (one of which is labeled 354) couples the unselected bias voltage nodes for the X-lines to ground. The unselected bias voltage nodes for the Y-lines are then brought to ground by way of the equilibration transistors 352. The discharge transistors 254 are preferably coupled to the X-line bias nodes, rather than the Y-line bias nodes, because the unselected X-lines are biased at a lower voltage than unselected Y-lines. By discharging the higher-voltage lines through the lower voltage lines and only then to ground, the timing between the FLOAT signal and the PULLDOWN signal is not critical. In fact, both signals may be asserted simultaneously without coupling lines below ground, because the Y-line bias nodes can only be discharged as fast as the X-line bias nodes.

With either circuit, a simple timing pulse may be used to provide a delay between the FLOAT signal and the PULLDOWN signal to time the amount of equilibration which should occur before beginning to discharge one or both set of nodes. Alternatively, an active circuit may be used to monitor one or more voltages to determine when to begin discharging. For example, each X-line/Y-line layer pair (i.e., each W*/B* layer pair) (4 total) may include an associated comparator to detect when its pair of lines are within a certain voltage difference and then assert a READY signal. When all four READY signals are active, the discharge circuit may be activated. Such a method may save time since the simple pulse approach must usually be set to accommodate the worst-case (longest) equilibration requirement.

Figure 20:
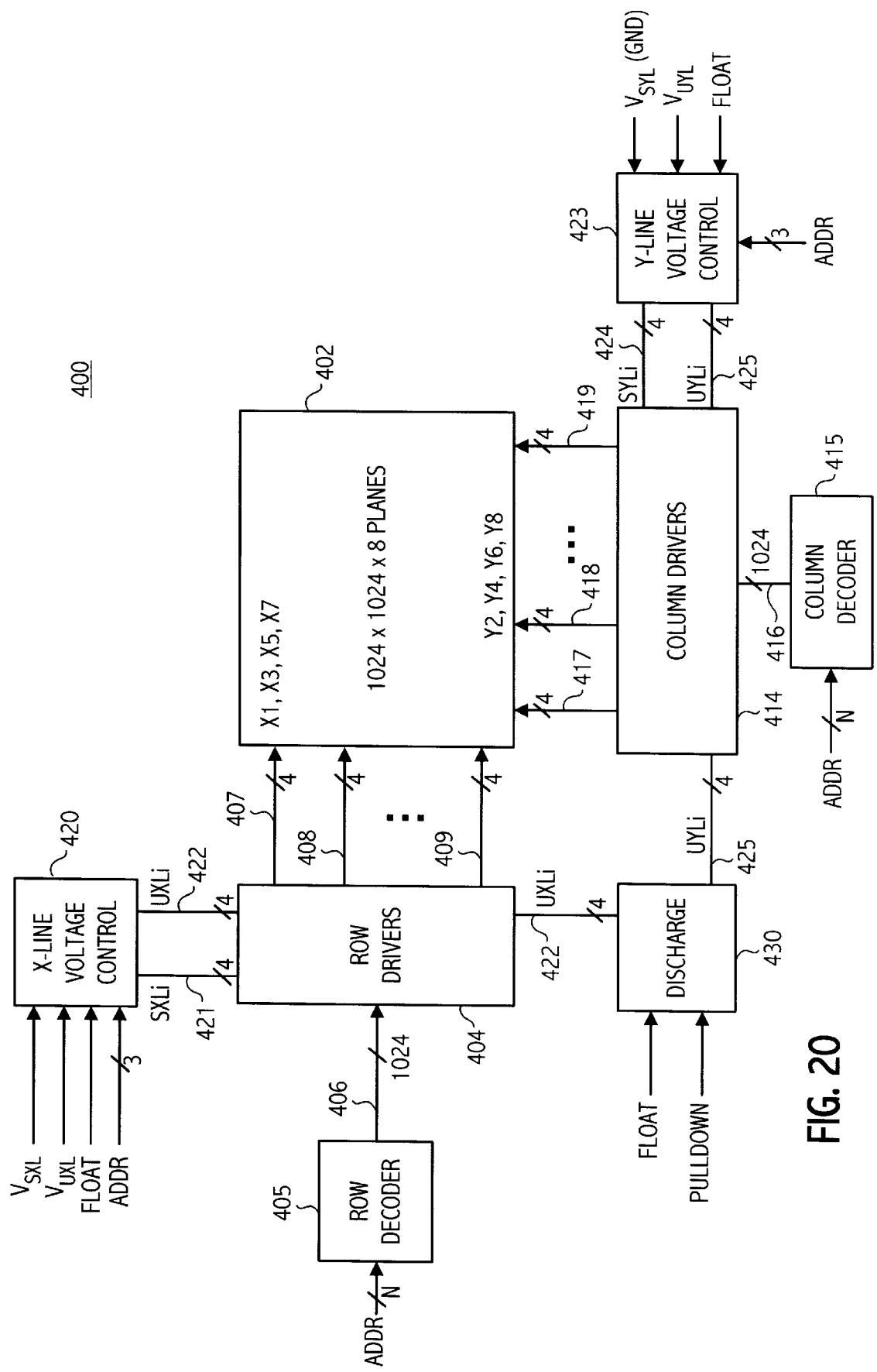
FIG. 20 is a functional block diagram of a memory array and supporting circuits in accordance with one aspect of the present invention.

FIG. 20 is an functional block diagram of an integrated circuit 400 illustrating various write circuits in accordance with one aspect of the present invention. Data paths and other control circuits are not illustrated for ease of description of the write-related circuits. The integrated circuit 400 includes a three-dimensional passive element memory array 402 arranged, for this example, as a 1024×1024×8 memory plane array. The array may be thought of as having 1024 rows and 1024 columns on each of 8 memory planes. A row decoder 405 decodes a group of addresses and generates a plurality of row select lines 406, in this example numbering 1024. As used herein, such a row decoder 405 should be interpreted broadly, and may include various levels of pre-decoders, voltage level shifters, and the like. Each row select line 406 is conveyed to a respective row driver circuit (shown collectively as row drivers 404), each of which is arranged to drive a respective group of four X-lines 407, 408, . . . 409 in accordance with which memory cell is selected. A first group of four X-lines 407 includes an X-line on each of four X-line layers, such as X1, X3, X5, and X7 (assuming a "word-line first and last" arrangement in the array). In this case, the unselected X-line bias node UXL1 controls the unselected bias level of X-lines on layer 1 and X-lines on layer 9. A fifth X-line layer X9 is preferably controlled by the same row driver circuit. Alternative implementations may add a fifth row driver circuit to control layer X9. The area of the overall driver circuit is increased, but by doing so, the leakage current can be reduced when the top-most or bottom-most memory layers are selected. In this description, the X-lines physically disposed on layer X9 are controlled identically as X1 layer lines and no distinction is needed. The description need only refer to four types of X-lines: X1, X3, X5, and X7. The other groups of X-lines 408, . . . 409 likewise include an X-line on each of the four X-line layers X1, X3, X5, and X7 (and X9 lines controlled as X7 lines).

An X-line voltage control circuit 420 receives the selected X-line voltage $V_{SXL}$ and the unselected X-line voltage $V_{UXL}$, and steers these voltages appropriately to generate a respective pair of bias nodes SXLi, UXLi for each of the four X-line layers. For each respective X-line layer, the respective bias node SXLi (labeled as 421) conveys the respective voltage to which a selected X-line on the respective layer should be driven, and the respective bias node UXLi (labeled as 422) conveys the respective voltage to which unselected X-lines on the respective layer should be driven. For each X-line layer, the first bias node SXLi provides the voltage to which a selected X-line on that layer should be driven, and the second bias node UXLi provides the voltage to which unselected X-lines on that layer should be driven. For example, the SXL3 bias node conveys the desired voltage for a selected X-line on the X3 layer. A group of addresses (or similar decoded address information) is also received by the X-line voltage control circuit 420 because the various X-line voltages depend upon which memory plane is selected (and which array is selected if the integrated circuit 400 includes more than one array).

A column decoder 415 decodes a group of addresses and generates a plurality of column select lines 416, in this example numbering 1024. As used herein, such a column decoder 415 should be interpreted broadly, and may include various levels of pre-decoders, voltage level shifters, and the like. Each column select line 416 is conveyed to a respective column driver circuit (shown collectively as column drivers 414), each of which is arranged to drive a respective group of four Y-lines 417, 418, . . . 419 in accordance with which memory cell is selected. A first group of four Y-lines 417 includes a Y-line on each of four Y-line layers, such as Y2, Y4, Y6, and Y8. The other groups of Y-lines 418, . . . 419 likewise include a Y-line on each of the four Y-line layers Y2, Y4, Y6, and Y8.

A Y-line voltage control circuit 423 receives the selected Y-line voltage $V_{SYL}$ (which, for this example, is the ground reference voltage) and the unselected Y-line line voltage $V_{UYL}$, and steers these voltages appropriately to generate a respective pair of bias nodes SYLi, UYLi for each of the four Y-line layers. For each respective Y-line layer, the respective bias node SYLi (labeled as 424) conveys the respective voltage to which a selected Y-line on the respective layer should be driven, and the respective bias node UYLi (labeled as 425) conveys the respective voltage to which unselected Y-lines on the respective layer should be driven. For each Y-line layer, the first bias node SYLi provides the voltage to which a selected Y-line on that layer should be driven, and the second bias node UYLi provides the voltage to which unselected Y-lines on that layer should be driven. For example, the SYL4 bias node conveys the desired voltage for a selected Y-line on the Y4 layer. A group of addresses (or similar decoded address information) is also received by the Y-line voltage control circuit 423 because the various Y-line voltages depend upon which memory plane is selected (and which array is selected if the integrated circuit 400 includes more than one array).

The unselected X-line bias nodes UXLi 422 and the unselected Y-line bias nodes UYLi 425 are also coupled to a discharge circuit 430 (such as the exemplary discharge circuit 350 described above). When the array 402 is to be taken into the inactive state, the FLOAT signal is asserted. When received by the X-line voltage control circuit 420, the various unselected X-line bias nodes UXLi 422 are de-coupled from the $V_{UXL}$ voltage. Alternatively, the $V_{UXL}$ bias voltage source (i.e., generator) may be disabled or otherwise turned off by the FLOAT signal to provide a high impedance on its output, and the FLOAT signal need not be conveyed to the X-line voltage control circuit 420.

When the asserted FLOAT signal is received by the Y-line voltage control circuit 423, the various unselected Y-line bias nodes UYLi 425 are de-coupled from the $V_{UYL}$ voltage. Alternatively, the $V_{UYL}$ bias voltage source (i.e., generator) may be disabled or otherwise turned off by the FLOAT signal to provide a high impedance on its output, and the FLOAT signal need not be conveyed to the Y-line voltage control circuit 423. The discharge circuit 430 preferably couples the unselected X-line bias nodes UXLi 422 to the unselected Y-line bias nodes UYLi 425, and couples at least some of them to ground to safely discharge the array.

The relative position of the various circuits within FIG. 20 were chosen for clarity of the figure, and should not be taken to necessarily imply a preferred physical arrangement on an integrated circuit die. Moreover, while the exemplary integrated circuit 400 is described in the context of a single memory array, preferred integrated memory circuits usually incorporate many separate memory arrays rather than just one.

Additional Comments

In certain embodiments, a memory array may be subdivided into more than one smaller array (or "sub-array"), thus decreasing the length of each X-line and Y-line. Consequently, the voltage drops arising from the resistance of the X-lines and the Y-lines is reduced which results in a greater voltage differential across a selected memory cell during programming. Since the time to program an antifuse within the memory cell decreases rapidly (e.g., by a factor of ten or more) with each volt change in the programming voltage, much faster programming of the antifuses is possible. Various arrangements of memory cell sub-arrays are described in co-pending, commonly-assigned application Ser. No. 09/748,649, filed on Dec. 22, 2000, entitled "Partial Selection of Passive Element Memory Cell Sub-Arrays for Write Operation" and naming Roy E. Scheuerlein and Matthew P. Crowley as inventors, which application is incorporated herein by reference in its entirety.

An advantageous three-dimensional array may also be implemented with a "word line first and last" arrangement (a layer of word lines (or X-lines) on the bottom of the array closest to circuitry within the substrate) rather than a "bit line first" arrangement as described variously herein to help reduce coupling onto the bottom-most layer of bit lines and coupling onto the top-most layer of bit lines from any lines passing over the array.

An advantageous passive element memory cell is a structure combining an antifuse and a diode in series as the memory cell. Suitable memory cells are described in U.S. application Ser. No. 09/814,727 entitled "Three-Dimensional Memory Array and Method of Fabrication" filed on Mar. 21, 2001 and naming as inventors N. Johan Knall and Mark G. Johnson, which is a continuation-in-part of U.S. application Ser. No. 09/560,626 entitled "Three-Dimensional Memory Array and Method of Fabrication" filed on Apr. 28, 2000 and naming as inventor N. Johan Knall, and in U.S. Pat. No. 6,034,882 entitled "Vertically Stacked Field Programmable Nonvolatile Memory and Method of Fabrication" which issued on Mar. 7, 2000, all three of which are incorporated by reference in their entirety;

While the invention has been largely described with respect to the embodiments set forth above, the invention is not necessarily limited to these embodiments. Variations and modifications of the embodiments disclosed herein may be made based on the description set forth herein, without departing from the scope and spirit of the invention. In particular, even though the preferred embodiments are described in the context of a passive element memory array, the teachings of the present invention are believed advantageous for use with other types of memory cells, such as certain 3-terminal memory cells. While certain embodiments have been described in the context of a three-dimensional, field-programmable, write once memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 to Knall, and U.S. patent application Ser. No. 09/638,428 to Johnson, each of which are hereby incorporated by reference. Specifically an antifuse memory cell is preferred. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently connected to the anode terminal of the memory cells, and Y-lines (or bit lines) are frequently connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

The embodiments described may show a selected word line being driven to a voltage and a selected bit line being sensed, and memory cell anode terminals connected to word lines and cathode terminals connected to bit lines, but other embodiments are specifically contemplated. For example, in a multi-level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and. of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. Such organizations (and others) are described in "Three-Dimensional Memory Array Incorporating Serial Chain Diode Stack" by Kleveland, et al, U.S. patent application Ser. No. 09/897,705, which is being filed on the same day as the present application, and which application is hereby incorporated by reference.

The directionality of X-lines (shown horizontally in the various figures) and Y-lines (shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art, and the invention in intended to comprehend a wide variety of such variations.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays.

In certain contexts, a write "cycle" may be synonymous with a write "operation." However, when viewed at the boundary of a memory array or memory device, a single external write "cycle" may actually cause several internal write "cycles" or "operations" to be sequentially performed at the memory array level, each writing data to a different group of memory cells. Unless the context so requires, a write cycle referred to herein is an internal write cycle or operation performed at the array level.

Regarding more general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "deactivated" when driven to the inactive level. A high logic level is frequently referred to as a logic "1" and a low logic level is frequently referred to as a logic "0" (at least for positive logic).

Frequently logic signals are named in a fashion to convey which level is the active level. For example, CLKEN is commonly used to name an active-high clock enable signal, because the true polarity is implied in the name. Conversely, CLKENB, /CLKEN, CLKEN#, CLKEN*, CLKEN_L, CLKEN_C, or #CLKEN are commonly used to name an active-low clock enable signal, because one of the many common expressions indicating the complement polarity is used in the name. Complementary pairs of signals or node names, such as true and complement clock lines, and true and complement bit lines within a column of a memory array, are frequently named to clarify the polarity of both nodes or signals (e.g., BL3T and BL3C; BL6_T and BL6_C) and in other instances, only the complement polarity may be indicated in the names (e.g., CLK and CLK#, or BL and BLB). In still other cases, two "complementary" signals are both inactive at one state (e.g., both inactive low), and only one is driven to an active level to convey the polarity of the signal. For example, two complementary address lines (e.g., A2T and A2C) may be both inactive low during a quiescent portion of a cycle. Later, A2T is driven high to indicate that the received address A2 is high (A2=H). Alternatively, A2C is driven high to indicate that the address received is low (A2=L). It is to be appreciated by those skilled in the art that these and other similar phrases may be used to name the signals and nodes. The schematic diagrams and accompanying description of the signals and nodes should in context be clear.

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). In a bipolar NPN transistor, the first current handling terminal may be deemed the emitter, the control terminal deemed the base, and the second current handling terminal deemed the collector. A sufficient base current into the base causes a collector-to-emitter current to flow (for typical collector-to-emitter operating voltages). In a bipolar PNP transistor, the first current handling terminal may be deemed the emitter, the control terminal deemed the base, and the second current handling terminal deemed the collector. A sufficient base current exiting the base causes an emitter-to-collector current to flow (for typical collector-to-emitter operating voltages).

An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficiently high voltage on the gate (relative to the source voltage) causes a current to therefore flow from the drain to the source (provided the respective voltage of the drain and source are different). For an enhancement mode N-channel device, a positive gate-to-source voltage greater than the threshold voltage (including body effect) is sufficient. The source voltage referred to in N-channel MOS device equations merely refers to whichever current handling terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current handling terminal may arbitrarily deemed the "drain" and the other deemed the "source", with an implicit understanding that the two are not distinct, but interchangeable.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "VDD", and the second power supply terminal is frequently named "VSS." Both terms may appear either using subscripts (e.g., $V_{DD}$) or not. Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC" (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794; "Passive Element Memory Array and Related Circuits Useful Therefor," U.S. Provisional Application No. 60/277,815; "Three-Dimensional Memory Array," U.S. Provisional Application No. 60/277,738; and "Three-Dimensional Memory Array and Method of Fabrication," U.S. application Ser. No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. Patent application Ser. No. 09/897,705; "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/895,960; "Current Sensing Method and Apparatus Particularly Useful for a Memory Array of Cells Having Diode-Like Characteristics," U.S. patent application Ser. No. 09/896,468; "Memory Array Incorporating Noise Detection Line," U.S. patent application Ser. No. 09/897,704; and "Memory Device and Method for Sensing while Programming a Non-Volatile Memory Cell," U.S. patent application Ser. No. 09/896,815.

What is claimed is:

1. In an integrated circuit including an array of passive element memory cells, each respectively coupled between a respective one of a plurality of X-lines and a respective one of a plurality of Y-lines, said integrated circuit having an operating mode biasing a group of at least one unselected Y-line at a different voltage than a group of at least one unselected X-line, a method of bringing each line of the Y-line group and each line of the X-line group to a particular voltage, said method comprising the steps of:

coupling each line of the Y-line group to each line of the X-line group so that the respective voltages of each such coupled together line are brought toward an intermediate voltage between the first and second voltages; and coupling at least one of such coupled together lines to a node conveying the particular voltage so that the respective voltages of each such coupled together line are brought to the particular voltage.

2. A method as recited in claim 1 wherein the first coupling step comprises:

coupling each respective line of the Y-line group through a respective Y-line driver to a common node serving each respective Y-line driver;

coupling each respective line of the X-line group through a respective X-line driver to a common node serving each respective X-line driver; and coupling the Y-line driver common node to the X-line driver common node.

3. A method as recited in claim 2 further comprising:

removing a source of the first voltage previously coupled to the Y-line driver common node before coupling the Y-line driver common node to the X-line driver common node; and removing a source of the second voltage previously coupled to the X-line driver common node before coupling the Y-line driver common node to the X-line driver common node.

4. A method as recited in claim 1 wherein the second coupling step comprises:

at least coupling one of the X-line driver common node and the Y-line driver common node to the particular voltage node whose respective voltage is already closer to the particular voltage.

5. A method as recited in claim 1 wherein the second coupling step comprises:

coupling both the X-line driver common node and Y-line driver common node to the particular voltage node.

6. A method as recited in claim 1 wherein:

the particular voltage is substantially equal to one of the respective voltages to which the group of X-lines and the group of Y-lines are initially biased.

7. A method as recited in claim 1 wherein:

the particular voltage is different than both of the respective voltages to which the group of X-lines and the group of Y-lines are initially biased.

8. A method as recited in claim 1 wherein:

the particular voltage comprises a ground reference voltage.

9. A method as recited in claim 1 wherein the second coupling step comprises:

coupling at least one of the X-line driver common node and Y-line driver common node to the particular voltage node.

10. A method as recited in claim 1 wherein:

the group of at least one unselected Y-line includes some but not all of the unselected Y-lines in the array.

11. A method as recited in claim 1 wherein:

the group of at least one unselected Y-line includes all of the unselected Y-lines in the array.

12. A method as recited in claim 1 further comprising:

deselecting any previously-selected Y-line before the first coupling step, thereby resulting in all Y-lines of the array being unselected during the first coupling step; and deselecting any previously-selected X-line before the first coupling step, thereby resulting in all X-lines of the array being unselected during the first coupling step.

13. A method as recited in claim 1 wherein:

the memory cells comprise write-once anti-fuse memory cells.

14. A method as recited in claim 1 wherein:

the memory cells comprise write-once fuse memory cells.

15. A method as recited in claim 1 wherein:

each memory cell comprises a layer of organic material having a resistance that is switched to a lower or higher state by application of a voltage across the layer.

16. In an integrated circuit including an array of passive element memory cells, each respectively coupled between a respective one of a plurality of X-lines and a respective one of a plurality of Y-lines, a method of discharging a group of at least one unselected X-line and a group of at least one unselected Y-line, said group of at least one unselected X-line previously biased at a voltage different than that of said group of at least one unselected Y-line, said method comprising the steps of:

sharing charge between the group of unselected Y-lines and the group of unselected X-lines, thereby tending to bring the respective voltage of each such unselected Y-line and the respective voltage of each such unselected X-line closer together in magnitude, and consequently reducing a respective voltage impressed across each unselected memory cell respectively coupled therebetween; and discharging the group of unselected Y-lines and the group of unselected X-lines to an inactive voltage.

17. A method as recited in claim 16 wherein the discharging step comprises:

coupling one of the group of unselected X-lines and the group of unselected Y-lines to the inactive voltage;

wherein the other of the group of unselected X-lines and group of unselected Y-lines is discharged to the inactive voltage by charge sharing between the group of unselected Y-lines and the group of unselected X-lines.

18. A method as recited in claim 16 wherein the discharging step comprises:

coupling both the group of unselected X-lines and the group of unselected Y-lines to the inactive voltage.

19. A method as recited in claim 16 wherein:

the inactive voltage comprises a ground reference voltage.

20. A method as recited in claim 16 wherein:

the discharging step is initiated substantially at the same time as the charge sharing step is initiated.

21. A method as recited in claim 16 further comprising:

deselecting any previously-selected one or more Y-lines and any previously-selected one or more X-lines either before or during the charge sharing step.

22. A method as recited in claim 16 wherein:

the discharging step is initiated substantially after the charge sharing step is initiated.

23. A method as recited in claim 22 further comprising:

initiating the discharging step a predetermined delay after initiating the charge sharing step.

24. A method as recited in claim 22 further comprising:

initiating the discharging step a variable delay after initiating the charge sharing step based upon determining a degree of charge sharing completeness.

25. A method as recited in claim 22 further comprising:

sensing at least one signal representative of the unselected Y-line voltages and at least one signal representative of the unselected X-line voltages to determine when the respective voltage difference therebetween falls within a certain range; and initiating the discharging step after determining that the respective voltage difference therebetween falls within the certain range.

26. A method as recited in claim 25 wherein:

the discharging step is initiated after the voltage impressed across each of said unselected memory cells has been reduced to within about 1.0 volt.

27. A method as recited in claim 25 wherein:

the discharging step is initiated after the voltage impressed across each of said unselected memory cells is less than a voltage difference between the inactive voltage and one of the group of unselected X-lines and the group of unselected Y-lines.

28. In an integrated circuit including an array of passive element memory cells, each respectively coupled between a respective one of a plurality of X-lines and a respective one of a plurality of Y-lines, a method of discharging the array comprising the steps of:

discharging inter-line capacitance between the unselected X-lines and the unselected Y-lines by coupling each unselected Y-line to each unselected X-line; and discharging stray capacitance on the unselected X-lines and unselected Y-lines by coupling at least the unselected X-lines or the unselected Y-lines to a ground reference node.

29. A method as recited in claim 28 wherein:

the stray capacitance discharging step is initiated substantially after the inter-line discharging step is initiated.

30. A method as recited in claim 28 wherein:

the stray capacitance is discharged by the stray capacitance discharging step at a slower rate than the inter-line capacitance is discharged by the inter-line capacitance discharging step.

31. A method as recited in claim 30 wherein:

the stray capacitance discharging step is initiated before the inter-line capacitance discharging step is completed.

32. A method as recited in claim 31 wherein:

the stray capacitance discharging step is initiated at about the same time as the first discharging step is initiated.

33. In an integrated circuit including an array of write-once passive element memory cells, each respectively coupled between a respective one of a plurality of X-lines and a respective one of a plurality of Y-lines, said integrated circuit having a write mode which biases a group of unselected Y-lines at an unselected Y-line voltage (UYL voltage) and which biases a group of unselected X-lines at an unselected X-line voltage (UXL voltage) that is different than the UYL voltage, a method of discharging each line of the Y-line group and each line of the X-line group comprising the steps of:

(a) coupling each respective line of the Y-line group through a respective Y-line driver to an unselected Y-line bias node (UYL bias node) for the Y-line drivers;

(b) coupling each respective line of the X-line group through a respective X-line driver to an unselected X-line bias node (UXL bias node) for the X-line drivers;

(c) coupling the UYL bias node to the UXL bias node; and (d) coupling at least one of the UYL bias node and the UXL bias node to a ground reference node.

34. A method as recited in claim 33 wherein step (d) comprises:

coupling both the UYL bias node and the UXL bias node to the ground reference node.

35. A method as recited in claim 33 wherein:

step (d) is initiated substantially before step (c) is initiated.

36. A method as recited in claim 33 wherein:

step (d) is initiated at about the same time as step (c) is initiated.

37. A method as recited in claim 33 wherein:

step (d) is initiated substantially after step (c) is initiated.

38. A method as recited in claim 37 wherein:

step (d) is initiated a predetermined delay after step (c) is initiated.

39. A method as recited in claim 33 wherein:
steps (a) and (b) are each initiated substantially before either step (c) or step (d) is initiated.

40. A method as recited in claim 33 wherein:
one of the UXL voltage and the UYL voltage is equal to the ground reference node voltage.

41. A method as recited in claim 33 wherein:
both the UXL voltage and the UYL voltage are different than the ground reference node voltage.

42. A method as recited in claim 33 further comprising:
removing a source of the UYL voltage previously coupled to the UYL bias node, and removing a source of the UXL voltage previously coupled to the UXL bias node, all before initiating step (c).

43. A method as recited in claim 33 further comprising:
deselecting any previously-selected one or more Y-lines and any previously-selected one or more X-lines, all before initiating step (c).

44. In an integrated circuit including at least one memory sub-array of passive element memory cells arranged in at least two memory planes, each memory cell of a given memory plane within a given sub-array respectively coupled to a respective one of a plurality of X-lines associated with the given memory plane and given sub-array, and further coupled to a corresponding one of a plurality of Y-lines associated with the given memory plane and given sub-array, a method of discharging a particular sub-array comprising the steps of:
coupling together, by way of one or more intermediate nodes, each of a respective group of X-lines associated with each respective memory plane within the particular sub-array, and each of a respective group of Y-lines associated with each respective memory plane within the particular sub-array, to discharge inter-line array capacitance existing therebetween; and
coupling at least one of the one or more intermediate nodes to a ground reference node, to discharge stray capacitance existing on the coupled-together X-lines and Y-lines.

45. A method as recited in claim 44 wherein:
a respective group of X-lines and a respective group of Y-lines associated with at least a first respective memory plane are previously biased to voltages different from the ground reference; and
a respective group of X-lines and a respective group of Y-lines associated with at least a second respective memory plane are previously floating.

46. A method as recited in claim 44 wherein:
the respective group of X-lines and the respective group of Y-lines associated with a first respective memory plane are previously biased to voltages different from the ground reference; and
all other respective groups of X-lines and all other respective groups of Y-lines not associated with the first respective memory plane are previously floating.

47. An integrated circuit comprising:
an array of passive element memory cells, each respectively coupled between a respective one of a plurality of X-lines and a respective one of a plurality of Y-lines;
means for biasing a group of at least one unselected Y-line at a voltage different than that of a group of at least one unselected X-line when in a write mode;
a first coupling circuit for coupling the group of unselected Y-lines to the group of unselected X-lines, for driving the respective voltages of each such coupled together line closer toward a single voltage; and
a second coupling circuit for coupling the group of at least one unselected Y-line and the group of at least one unselected X-line to an inactive voltage.

48. A circuit as recited in claim 47 wherein the means for biasing comprises:
a plurality of X-line driver circuits for biasing unselected X-lines to a first voltage during the write mode;
a plurality of Y-line driver circuits for biasing unselected Y-lines to a second voltage different than the first voltage during the write mode.

49. An integrated circuit comprising:
at least one memory sub-array of passive element memory cells arranged in at least two memory planes, each memory cell of a given memory plane within a given sub-array respectively coupled to a respective one of a plurality of X-lines associated with the given memory plane and given sub-array, and further coupled to a corresponding one of a plurality of Y-lines associated with the given memory plane and given sub-array;
for each memory plane within each sub-array, said integrated circuit further comprising
first means for biasing unselected X-lines associated with the memory plane of the sub-array at a different voltage than unselected Y-lines associated with the memory plane of the sub-array, when in a write mode;
second means for coupling unselected X-lines associated with the memory plane of the sub-array to unselected Y-lines associated with the memory plane of the sub-array; and
third means for coupling to a ground reference node the coupled-together unselected X-lines and unselected Y-lines associated with the memory plane of the sub-array.

50. The integrated circuit as recited in claim 49 wherein, for each sub-array, the integrated circuit further comprises:
means for coupling unselected X-lines or Y-lines associated with one memory plane of the sub-array to unselected X-lines or Y-lines associated with at least one other memory plane of the sub-array.

51. The integrated circuit as recited in claim 49 wherein:
the third means comprises at least a conductive path between the ground reference node and one of the coupled-together X-lines and the coupled-together Y-lines;
wherein the other of the coupled-together X-lines and the coupled-together Y-lines is coupled to the ground reference node through the second means.

* * * * *